(12) United States Patent
Kasae et al.

(10) Patent No.: US 9,093,621 B2
(45) Date of Patent: Jul. 28, 2015

(54) MOLDED PACKAGE FOR LIGHT EMITTING DEVICE

(71) Applicant: Nichia Corporation, Tokushima (JP)

(72) Inventors: Nobuhide Kasae, Anan (JP); Keisuke Sejiki, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 13/728,530

(22) Filed: Dec. 27, 2012

(65) Prior Publication Data
US 2013/0168723 A1 Jul. 4, 2013

(30) Foreign Application Priority Data

Dec. 28, 2011 (JP) ................................ P2011-289846
Dec. 28, 2011 (JP) ................................ P2011-289848
Dec. 27, 2012 (JP) ................................ P2012-284130

(51) Int. Cl.
| | |
|---|---|
| *H01L 33/00* | (2010.01) |
| *H01L 21/00* | (2006.01) |
| *H01L 33/52* | (2010.01) |
| *H01L 33/62* | (2010.01) |
| *F21V 21/00* | (2006.01) |
| *H01L 33/48* | (2010.01) |

(52) U.S. Cl.
CPC ................ *H01L 33/52* (2013.01); *F21V 21/00* (2013.01); *H01L 33/62* (2013.01); *H01L 33/486* (2013.01); *H01L 2224/73265* (2013.01); *H01L 2933/005* (2013.01); *H01L 2933/0066* (2013.01)

(58) Field of Classification Search
CPC ........... H01L 2224/48091; H01L 2924/00014; H01L 2224/48247; H01L 2924/00; H01L 2224/73265; H01L 2924/00012; H01L 2224/32245; H01L 2224/48465; H01L 2224/97; H01L 2924/0132; H01L 33/486; H01L 33/62; H01L 2224/451

USPC ............... 257/80–82, 99, 100, 116, 419, 433, 257/434, 734, 666, 660, 677, 678, 684, 257/686–690, 696–698, 699, 700–705, 257/708–711, 730, 777–790, 692–694, 795, 257/E27.161, E23.039, E33.056, E23.001, 257/E23.061, E23.04, E23.06, E23.063, 257/E23.169, E23.178, E21.503, E21.511, 257/E23.038, E29.324, E23.174, E23.181; 438/15, 25, 26, 51, 64, 106, 108, 112, 438/116, 119, 121, 123–127

See application file for complete search history.

(56) References Cited

U.S. PATENT DOCUMENTS

| | | | |
|---|---|---|---|
| 2005/0156187 A1 | 7/2005 | Isokawa et al. | |
| 2008/0122120 A1* | 5/2008 | Itoh et al. | 257/784 |
| 2008/0237627 A1* | 10/2008 | Kobayakawa | 257/99 |
| 2009/0050925 A1* | 2/2009 | Kuramoto et al. | 257/100 |

FOREIGN PATENT DOCUMENTS

| | | |
|---|---|---|
| JP | 2003-264267 | 9/2003 |
| JP | 2008-251937 | 10/2008 |
| JP | 2009-076524 | 4/2009 |

* cited by examiner

*Primary Examiner* — Colleen A Matthews
*Assistant Examiner* — Junaiden Mirsalahuddin
(74) *Attorney, Agent, or Firm* — Foley & Lardner LLP

(57) ABSTRACT

The present invention provides a molded package for a light emitting device including a molded resin and first and second leads, the exposed surface of the first lead having a first and second edge portions opposed to each other so as to put a mounting area therebetween in a first direction, the first and second edge portions respectively having one first cutout and second cutouts, the mounting area having a size not less than a distance between the first and the second cutouts and less than a distance between the first the second edge portions in the first direction.

16 Claims, 30 Drawing Sheets

Fig.20
(a)
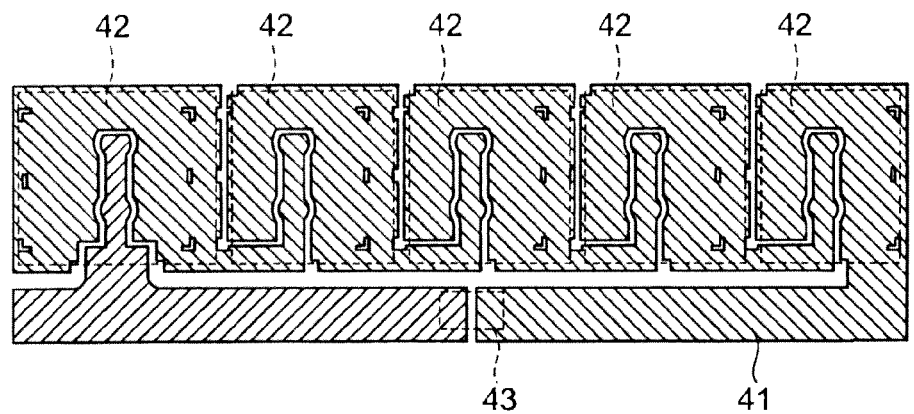
(b)
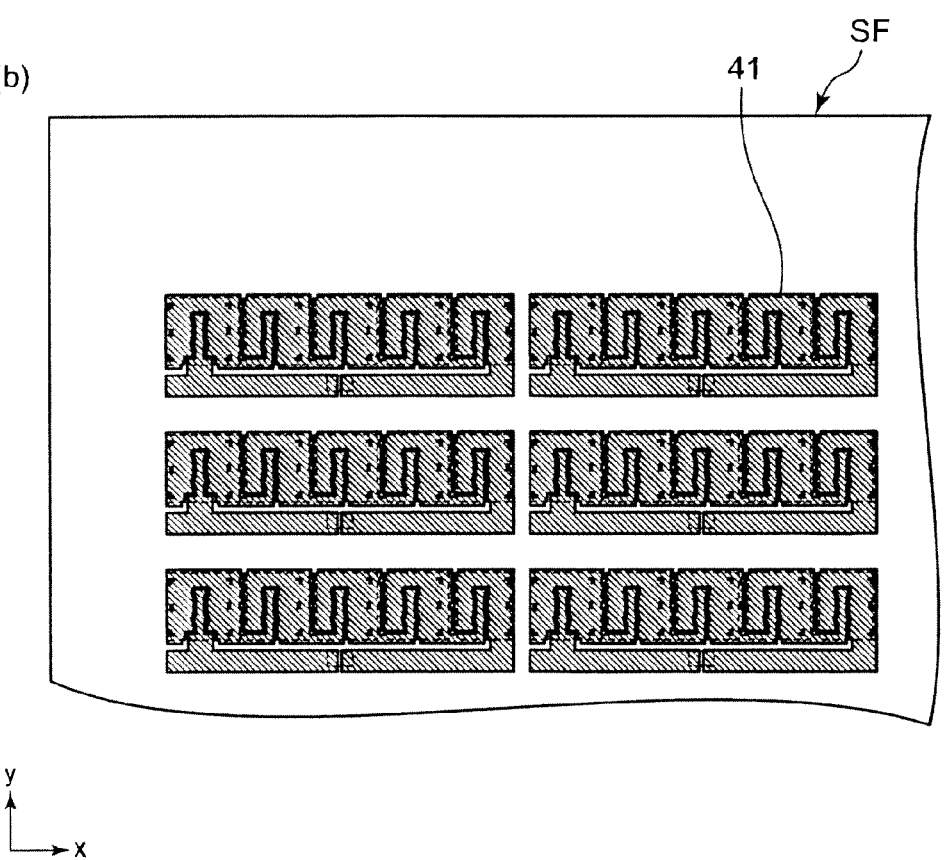

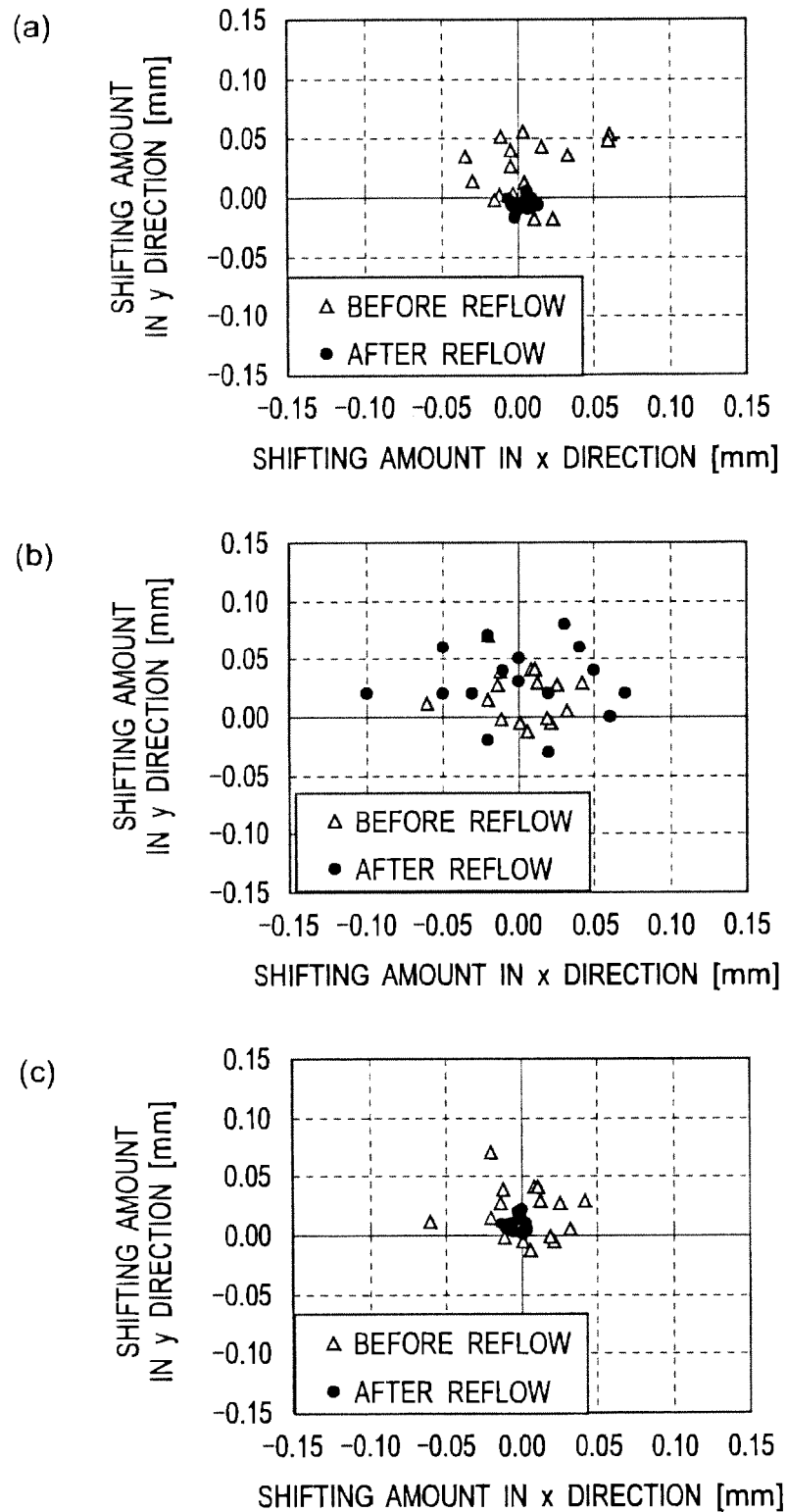

MOLDED PACKAGE FOR LIGHT EMITTING DEVICE

BACKGROUND OF THE INVENTION

1. Field of the Invention

The present invention relates to a molded package for a light emitting device.

2. Description of the Related Art

In conventional light emitting devices, it is known to match a size of a die pad portion of a package with a size of a light emitting element chip (a light emitting component) as well as to provide a projecting portion to the die pad portion for getting rid of an excessive solder (see, for example, JP-A-2009-76524 and JP-A-2003-264267). By matching the size of the die pad portion with the size of the chip, the chip can be self-aligned with the die pad portion. The projecting portion suppresses to enter the excessive solder into a wire bonding area and suppresses to tilt the chip due to too thick solder. For these reasons, the light emitting devices disclosed in JP-A-2009-76524 and JP-A-2003-26426 enables to accurately mounting the light emitting element chip into the package.

JP-A-2008-251937 discloses a package, in which a rear surface of leads is exposed to a rear surface of a package, in order to effectively remove heat generated in the light emitting component to the mounted substrate via the leads, is known.

In the light emitting devices disclosed in JP-A-2009-76524 and JP-A-2003-264267, the size of the light emitting element chip is required to be matched with the size of the die pad portion, so that a chip having a size different from that of the prior chip cannot be packaged having the prior size and shape. Therefore, every time the size of the chip is changed, a package suitable for the changed size of the chip is required to be newly produced.

When a shape of the electrode to be used in the light emitting device disclose in JP-A-2009-76524 and JP-A-2003-264267 is applied to a frame insert type resin package which is inexpensive in manufacturing, a boundary between the lead and a molding resin increases. If a surface of the resin package is sealed with a sealing resin, the sealing resin may be leaked to the rear surface of the resin package through the boundary between the lead and the molding resin. When an outer lead is provided on the rear surface of the resin package, the outer lead portion is contaminated by the sealing resin to invite a poor wettability of solder. The leakage of the sealing resin occurs more in the package in which the rear surfaces of the leads are exposed to the rear surface of the package as disclosed in JP-A-2008-251937.

SUMMARY OF THE INVENTION

Thus, a first object of the present invention is to provide a molded package capable of mounting the light emitting component having different size on a predetermined position accurately.

A second object of the present invention is to provide a molded package capable of mounting the light emitting component via a self-alignment and suppressing a leakage of the sealing resin for sealing the light emitting component to a rear surface of the molded resin.

A first molded package of the present invention, which is to achieve the first object, comprises: a molded resin having a recess portion for accommodating a light emitting component; and a first lead and a second lead which are spaced each other at a bottom surface of the recess portion of the molded resin and exposed from the bottom surface of the recess portion, wherein an exposed surface of the first lead has a first edge portion and a second edge portion which are opposed to each other so as to put a mounting area for the light emitting component therebetween in a first direction, the first edge portion having one first cutout and the second edge portion having a plurality of second cutouts, and wherein the mounting area for the light emitting component has a size in the first direction equal to or more than a distance between the first cutout and the second cutouts and less than a distance between the first edge portion and the second edge portion.

In the present specification, the "mounting area for the light emitting component" indicates a region preliminary defined as a region in the exposed surface of the first lead on which the light emitting component is to be mounted. A size and shape of the mounting area is almost identical to those of the light emitting component to be actually mounted thereon. A position of the mounting area is decided on the basis of a design of the molded package and a size and a shape of the light emitting component to be mounted thereon. In the present specification, the "cutout" is a portion formed on the exposed surface of the first lead in order to shape the edge of the first lead into a concave-convex shape. The cutout may be formed so as to pass through the first lead from the exposed surface to a rear surface of the first lead, or may be formed such as "a concave portion" which is formed on the exposed surface of the first lead and does not pass through to the rear surface of the first lead.

According to the first molded package of the present invention, the mounting area for the light emitting component has a size in the first direction equal to or more than a distance between the first cutout and the second cutouts and less than a distance between the first edge portion and the second edge portion. As a result, a position of the light emitting component in a length direction can be precisely self-aligned with the mounting area for the light emitting component to be accurately mounted thereon.

According to the first molded package of the present invention, a plurality of second cutouts can be provided, as required, according to the mounting area, so that a position of the light emitting component in a second direction (i.e., a direction perpendicular to the first direction) can also be self-aligned with the mounting area to be accurately mounted thereon.

In the present specification, the "self-alignment" means that, even if the position of the light emitting component is shifted from the mounting area when the light emitting component is place on the exposed surface of the first lead via the solder, the light emitting component is (automatically) repositioned on the mounting position according to a surface tension of the solder during a reflow.

The second molded package of the present invention, which is also to achieve the first object, comprises: a molded resin having a recess portion for accommodating a light emitting component; and a first lead and a second lead which are spaced each other at a bottom surface of the recess portion of the molded resin and exposed from the bottom surface of the recess portion, wherein an exposed surface of the first lead has a first cutout and a plurality of second cutouts which are opposed to each other in a first direction, and has a third cutout and a fourth cutout which are opposed to each other in a second direction perpendicular to the first direction, wherein the plurality of second cutouts is disposed between the first cutout and the second lead in the first direction.

In the present specification, "the first cutout and the plurality of second cutouts are opposed to each other in a first direction" means one first cutout and whole of the plurality of second cutouts are opposed to each other in the first direction. Therefore, there is no necessary to form both the first cut out and one of the second cutouts on a line extending in the first direction.

In the second molded package of the present invention, the first cutout, the second cutouts, the third cutout and the fourth cutout are formed on an exposed surface of the first lead. The first cutout is opposed to the second cutouts in the first direction, and the third cutout is opposed to the fourth cutout in a second direction. Therefore, in a case where the light emitting component is mounted on the exposed surface of the first lead, a position of the light emitting component in the first direction is self-aligned by the first cutout and the second cutouts, and a position of the light emitting component in the second direction is self-aligned by the third cutout and the fourth cutout.

Consequently, in the second molded package of the present invention, the light emitting component can be mounted by the self-alignment within an area defined by the first cutout, the second cutouts, the third cutout and the fourth cutout in the exposed surface of the first lead.

A third molded package of the present invention, which is to achieve the second object, comprises: a molded resin having a recess portion for accommodating a light emitting component; and a first lead and a second lead which are spaced each other at a bottom surface of the recess portion of the molded resin and at a rear surface of the molded resin and exposed from the bottom surface and the rear surface, wherein an exposed surface of the first lead exposing from the bottom surface of the recess portion has a first edge portion and a second edge portion which are opposed to each other so as to put a mounting area for the light emitting component therebetween in a first direction, the first edge portion having a first cutout filled with the molded resin, wherein an inner side surface of the recess portion of the molded resin is in contact with the first edge portion, the recess portion of the molded resin having a projecting portion projecting from the inner side surface of the recess portion and the projecting portion partially covering the first cutout except for a top portion of the first cutout, and wherein the mounting area for the light emitting component having a size in the first direction equal to or more than a distance between the top portion of the first cutout and the second edge portion and less than a distance between the projecting portion and the second edge portion.

The "rear surface of the molded resin" is a surface opposite to the surface of the molded resin on which the recess portion is formed.

According to the third molded package of the present invention, since the mounting area for the light emitting component has a size in the first direction equal to or more than a distance between the top portion of the first cutout and the second edge portion and a distance less than the projecting portion and the second edge portion, the light emitting component can be precisely self-aligned to be mounted on the mounting position of the light emitting component in the first direction.

According to the third molded package, the projecting portion projecting toward the inside of the recess portion from the inner side surface of the recess portion of the molded resin partially covers the first cutout, which can effectively suppress the leakage of the sealing resin to the rear surface of the molded package from the periphery of the first cutout. Since the projecting portion does not cover the top portion of the first cutout, an effect of the self-alignment of the light emitting component by the first cutout would not be inhibited.

In the first molded package of the present invention, the light emitting component can be accurately self-aligned with and mounted on the mounting position owing to the first cutout and the plurality of second cutouts. Such a self-alignment effect can be produced with any size of the light emitting component in the second direction. Therefore, in the molded package of the present invention, each of light emitting components having different sizes can be mounted on the mounting area accurately.

In the second molded package of the present invention, the light emitting component can be self-aligned and mounted in either the first direction or the second direction by the first cutout, the second cutouts, the third cutout, and the fourth cutout.

In the third molded package of the present invention, the self-alignment of the light emitting component can be self-aligned and mounted by the first cutout and further the leakage of the sealing resin for sealing the light emitting component can be suppressed by the projecting portion.

BRIEF DESCRIPTION OF THE DRAWINGS

FIG. 20(a) is a front view of a submount. FIG. 20(b) is a front view of the frame equipped with a plurality of submount.

FIGS. 30(a) to 30(c) are a graph illustrating an experimental result of a self-alignment by using the light emitting device of FIGS. 29(a) to 29(c).

DETAILED DESCRIPTION OF THE INVENTION

<First Embodiment>

Figure 1:
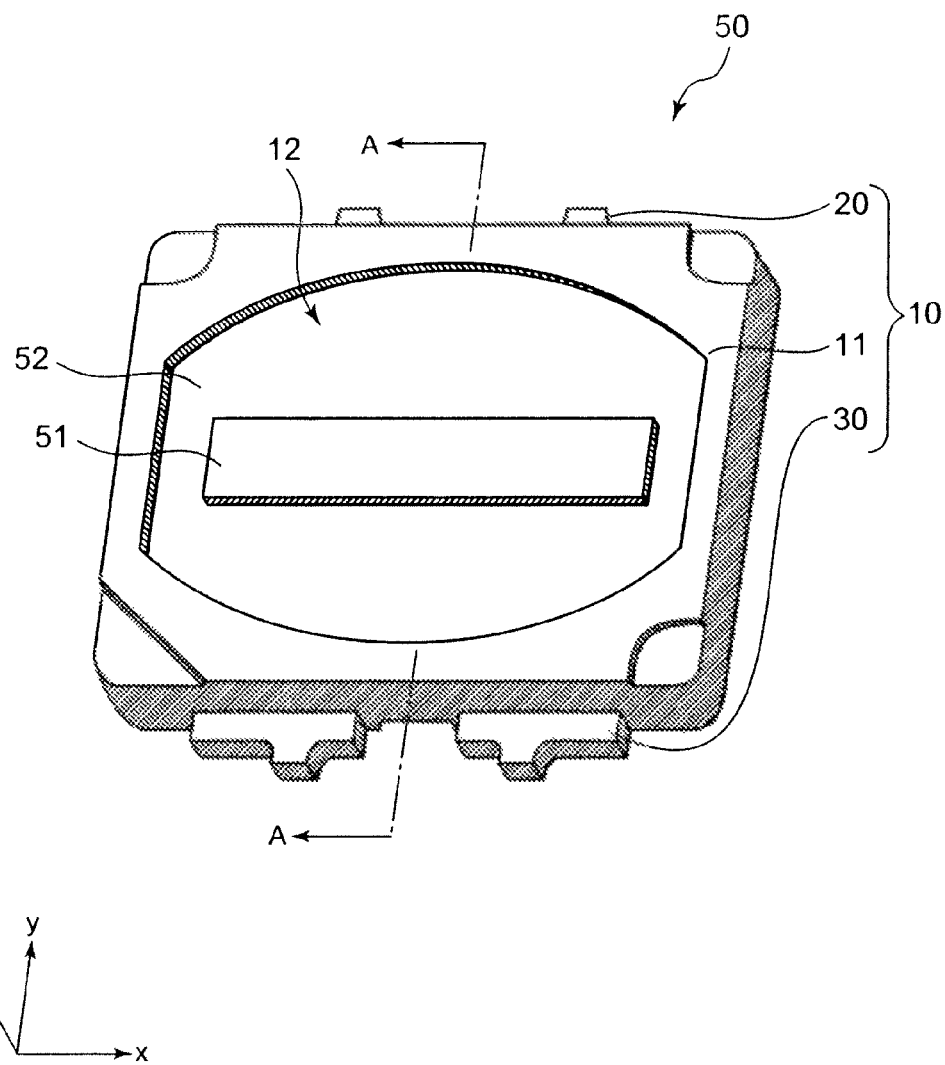
FIG. 1 is a perspective view of a light emitting device according to a first embodiment.
Figure 2:
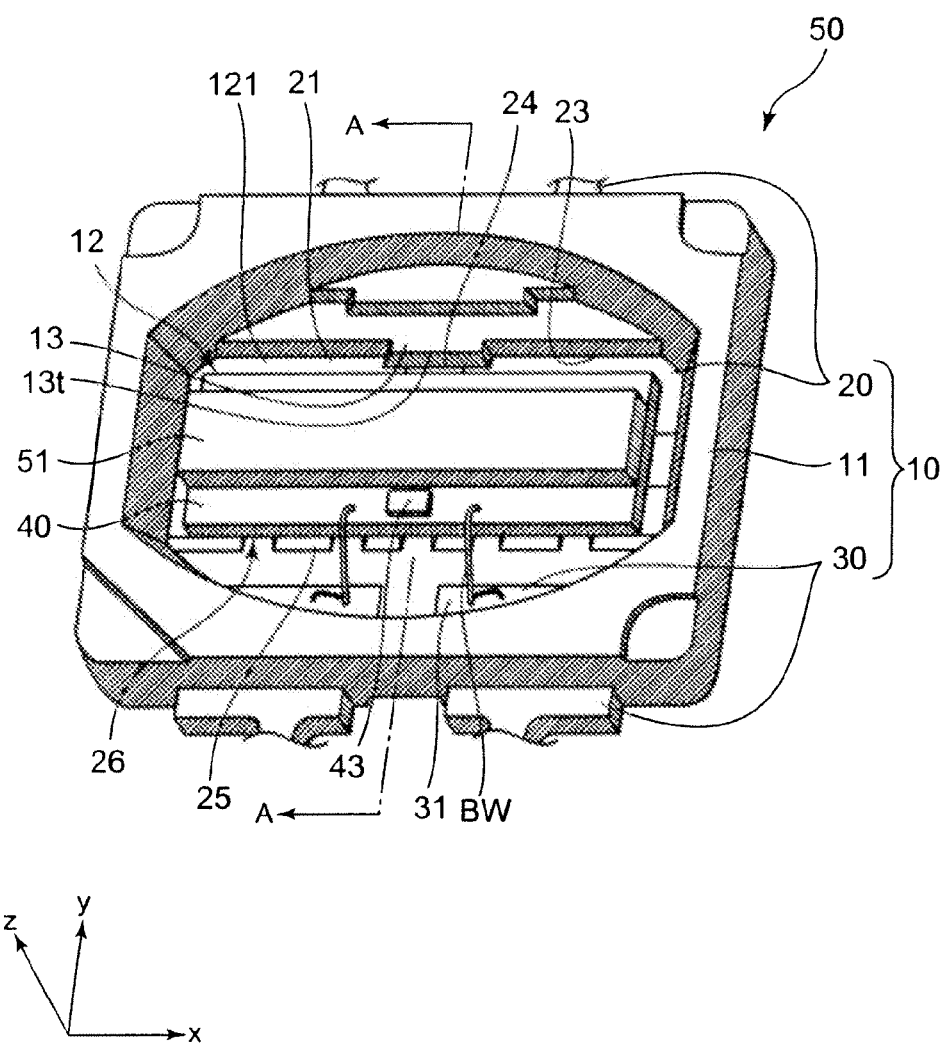
FIG. 2 is a perspective view illustrating a state of the light emitting device of FIG. 1 before it is sealed with a sealing resin.
Figure 3:
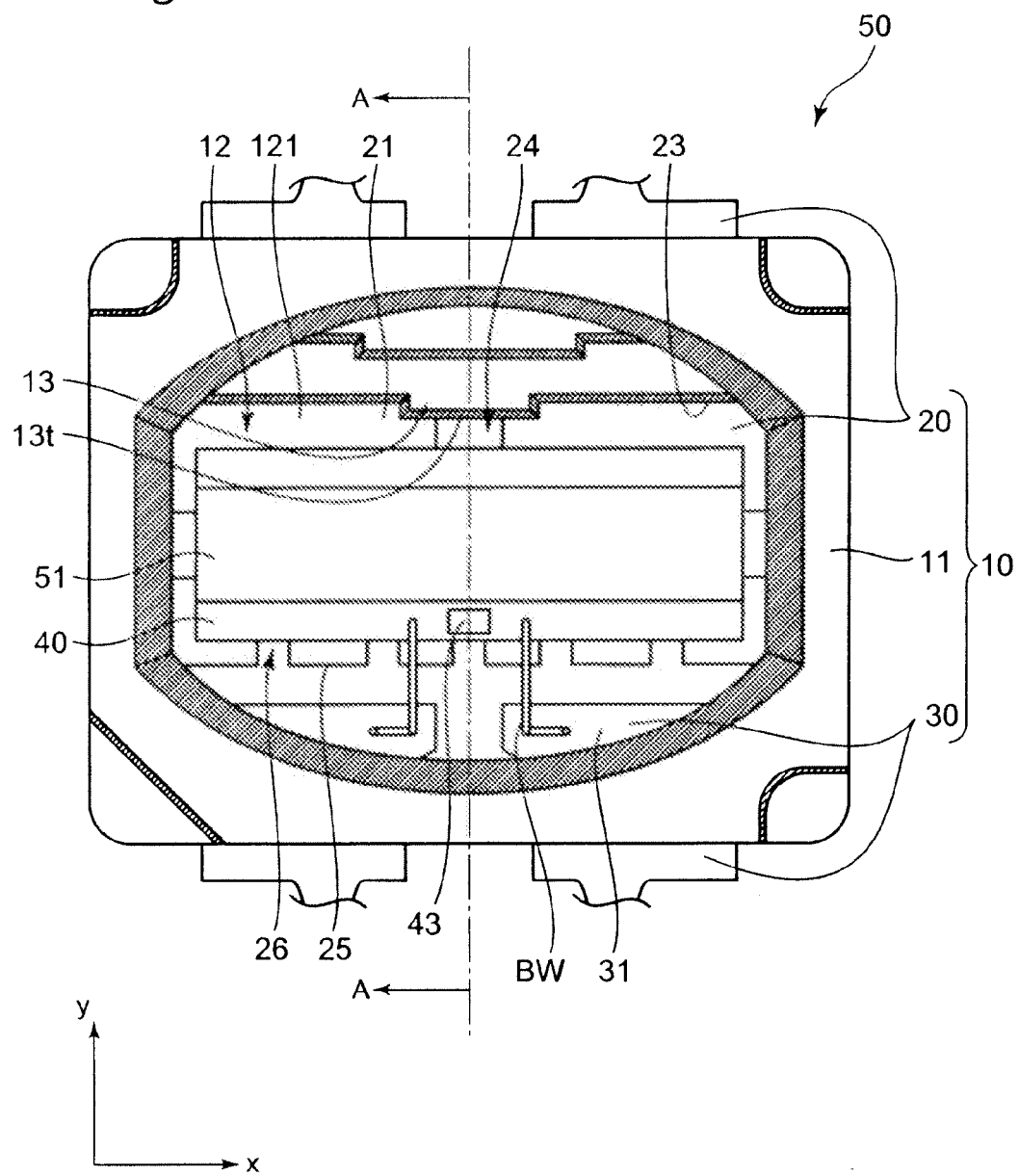
FIG. 3 is a front view of the light emitting device before sealed as illustrated in FIG. 2.
Figure 4:
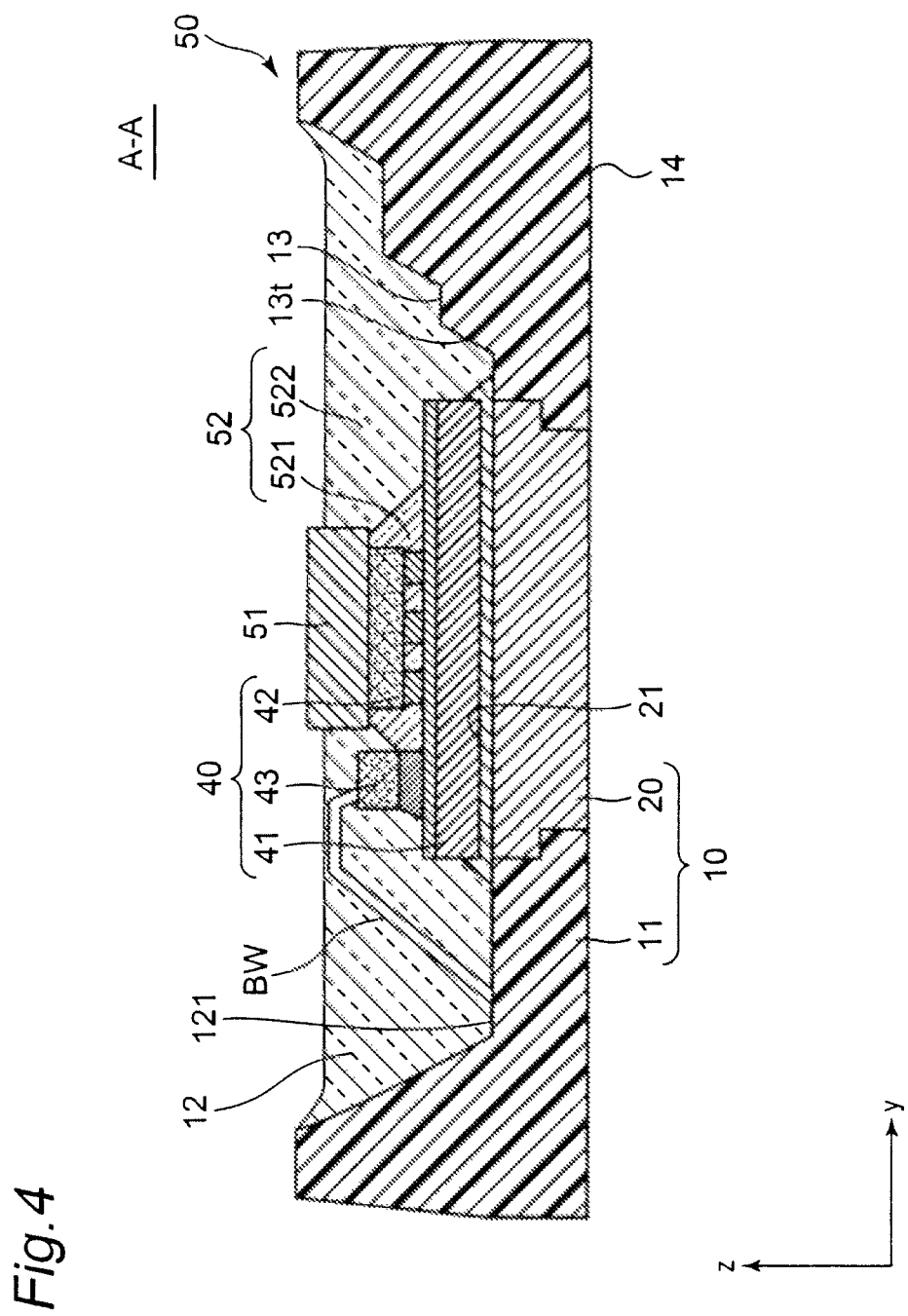
FIG. 4 is a cross sectional view of the light emitting device illustrated in FIG. 1.

The present embodiment relates to a molded package capable of achieving a first object of the present invention and a light emitting device using the same.

That is, the present embodiment discloses the molded package capable of precisely mounting the light emitting component having any size at a predetermined position and the light emitting device using the same.

As illustrated in FIGS. 1 to 4, a light emitting device 50 of the present embodiment comprises a molded package 10, a light emitting component 40, a sealing resin 52, and a wavelength conversion member 51.

The molded package 10 includes a molded resin 11 having a recess portion 12 for accommodating the light emitting component 40 and a first lead 20 and a second lead 30 (which is made of two independent members) which are spaced each other at a bottom surface 121 of the recess portion 12 of the molded resin 11 and exposed from the bottom surface 121 of the recess portion 12. The light emitting component 40 is mounted on the exposed surface 21 of the first lead 20 within the recess portion 12 and is electrically connected with exposed surfaces 31 of the second lead 30 via bonding wires BW.

Figure 5:
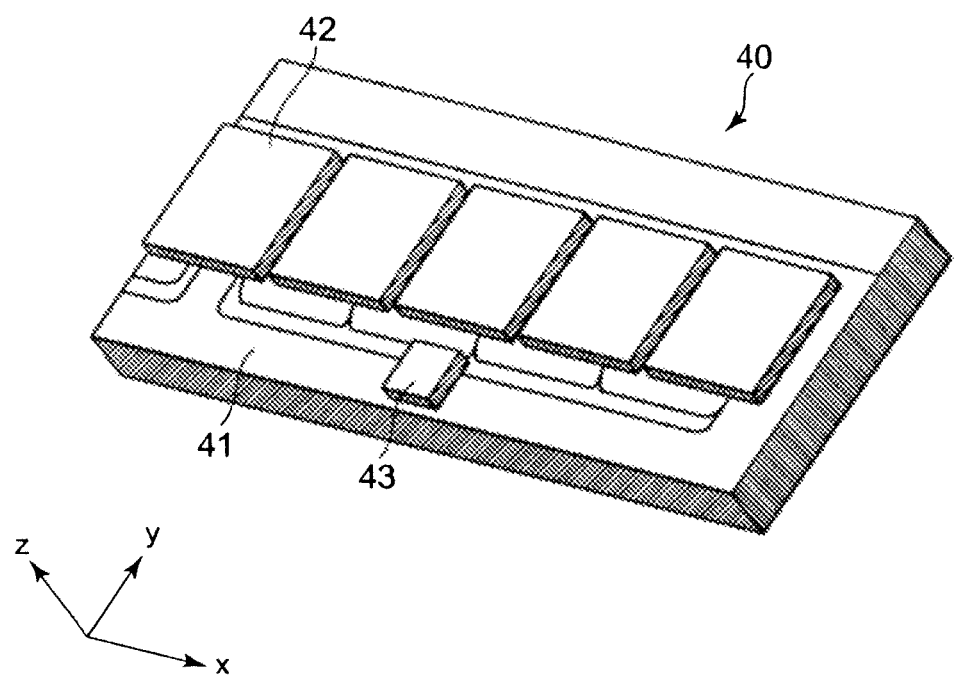
FIG. 5 is a perspective view of the light emitting component mounted on the light emitting device illustrated in FIG. 2.

In the present specification, the "light emitting component" indicates a component including the light emitting element, and includes, for example, the light emitting element (e.g., an LED) itself and a component including the light emitting element and a submount. The light emitting component 40 of the present embodiment includes the light emitting element 42, a zener diode 43 for protecting the light emitting element 42, and the submount 41 on which the light emitting element 42 and the zener diode 43 are mounted (see, FIGS. 4 and 5). The present invention, however, is not limited to the above configuration.

According to the "light emitting component in the present specification, metal lines are formed on the submount 41 and the light emitting element 42 is mounted on the metal limes with its face down (or flip-chip) via a bump of, for example, Au in the form of "face down mounting". Alternatively, light emitting element 42 may be mounted on the submount 41 with its face up, and may directly connect with the bonding wires. Since the submount 41 (on which the light emitting element 42 is mounted) is mounted on the lead, the light emitting element 42 can be connected with a circuit board acting as an external electrodes through the leads and heat generated in the light emitting element 42 can be efficiently discharged through the submount 41. An AlN, an $Al_2O_3$, a SiC, and a glass epoxy substrate can be used as the submount 41. The AlN having a high heat conductivity is preferred among those.

Figure 6:
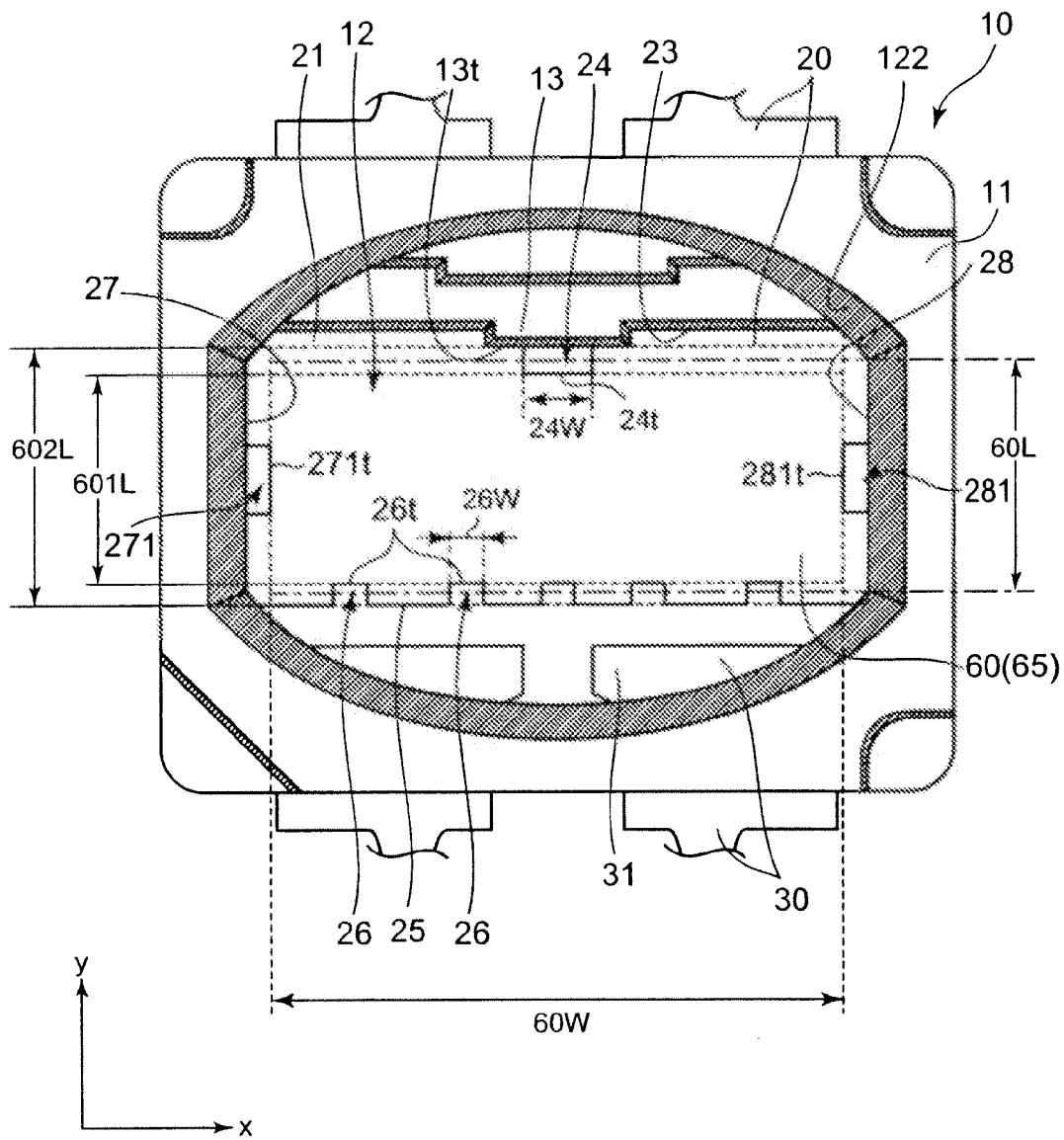
FIG. 6 is a front view of a molded package used in the light emitting device illustrated in FIG. 2.

As illustrated in FIG. 6, in the molded package 10 of the present embodiment, the exposed surface 21 of the first lead 20 has the first edge portion 23 and the second edge portion 25 which are opposed to each other so as to put a mounting area 60 for the light emitting component 40 therebetween in a first direction (i.e., referred to as "y direction" or "length direction" in the present specification).

In the present specification, the "mounting area 60 of the light emitting component 40" is an area preliminary defined for mounting the light emitting component 40 on the exposed surface 21 of the first lead 20. In a case of designing the molded package 10, the mounting area 60 is defined in consideration with emission properties (i.e., directivity) of the light emitting component 40 and the other parts provided in the recess portion 12 of the molded resin 11. A size and a shape of the mounting area 60 are almost identical to those of the light emitting component to be mounted thereon.

In the present specification, the "first edge portion 23" and the "second edge portion 25" of the first lead 20 are edge portions extending in a direction crossing to the y direction in the edge portion enclosing the exposed surface 21 of the first lead 20. In the present embodiment, the molded resin 11 of the molded package 10 has a projecting portion 13 projecting from the first edge portion 23 into the recess portion 12, so that the first edge portion 23 is not a straight line. On the other hand, the second edge portion 25 is a straight line in parallel with the x direction except for the second cutouts 26. The first edge portion 23 and the second edge portion 25 are not limited to what are described above but may be, for example, an edge portion inclining in the x direction or a curved edge portion.

The first lead 20 is equipped with a singular first cutout 24 on the first edge portion 23 and a plurality of second cutouts 26 on the second edge portion 25. The molded resin 11 is filled in the first cutout 24 and the second cutouts 26. The solder is supplied in the form of solder paste for the use in mounting the light emitting component 40. However, the solder in a molten state has a low wettability with respect to the molded resin 11 and, whereas, has a high wettability with respect to the first lead 20. Therefore, if the solder is molten by the reflow, thus molten solder gathers on the exposed surface 21 of the first lead 20. The light emitting component 40 riding on the molten solder is moved due to a surface tension of the solder (i.e., self-alignment). The self-alignment in the length direction (i.e., a y direction) of the light emitting component 40 is controlled by the first cutout 24 of a side of the first edge portion 23 and the second cutouts 26 of a side of the second edge portion 25. Conceptually, the light emitting component 40 is self-aligned such that a center line between a first side 401 and a second side 402 of the light emitting component 40 matches a center line between the first cutout 24 of the first edge portion 23 and the second cutouts 26 of the second edge portion 26 in order to minimize a surface of the molten solder.

More specifically, a length 401 of the light emitting component 40 (which is equal to a length 60L of the mounting area 60) is equal to or more than a distance 601L between the first cutout 24 and the second cutouts 26 and less than a distance 602L between the first edge portion 23 and the second edge portion 25. Therefore, a top portion 24t of the first cutout 24 comes to lie flush with the first side 401 of the light emitting component 40 or the top portion 24t is positioned underside of the light emitting component 40. Similarly, top portions 26t of the second cutouts 26 comes to lie flush with the second side 402 of the light emitting component 40 or the opt portions 26t are positioned underside of the light emitting component 40. As described above, the molten solder deforms such that the surface thereof becomes minimum. Therefore, the first side 401 of the light emitting component 40 is stressed such that a distance between the first side 401 and the top portion 24t of the first cutout 24 becomes shorter, whereas the second side 402 of the light emitting component 40 is stressed such that a distance between the second side 402 and the top portions 26t of the second cutouts 26 becomes shorter. As a result, the light emitting component 40 is self-aligned at a position (i.e., the mounting area 60) at which the stress which the two sides 401 and 402 are suffered from the molten solder is balanced (see, FIG. 7).

The similar self-alignment effect can be produced not only by the light emitting component 40 including the submount but also by the light emitting component 40 including only the light emitting element.

According to the reason as described above, the length 60L of the mounting area 60 is set to a value equal to or more than a distance 601L between the first cutout 24 and the second cutouts 26 and less than the distance 602L between the first edge portion 23 and the second edge portion 25, resulting in capable of causing a position of the light emitting component 40 in the length direction (i.e., y direction) of the light emitting component 40 can be self-aligned to be accurately mounted on the mounting area 60.

The "length 60L" of the mounting area 60 means a size of the mounting area 60 in the y direction.

The "distance 601L between the first cutout 24 and the second cutouts 26" indicates a distance from a line defined by the top portions 26t of the plurality of second cutouts 26 to the top portion 24t of the first cutout 24.

The "distance 602L between the first edge portion 23 and the second edge portion 25" means, in a case where there is the projecting portion 13 as illustrated in FIG. 6, the maximum distance 602L is a distance from a top edge 13t of the projecting portion 13 (i.e., a portion of the first edge portion 23 nearest to the second edge portion 25) to the second edge portion 25.

Figure 7:
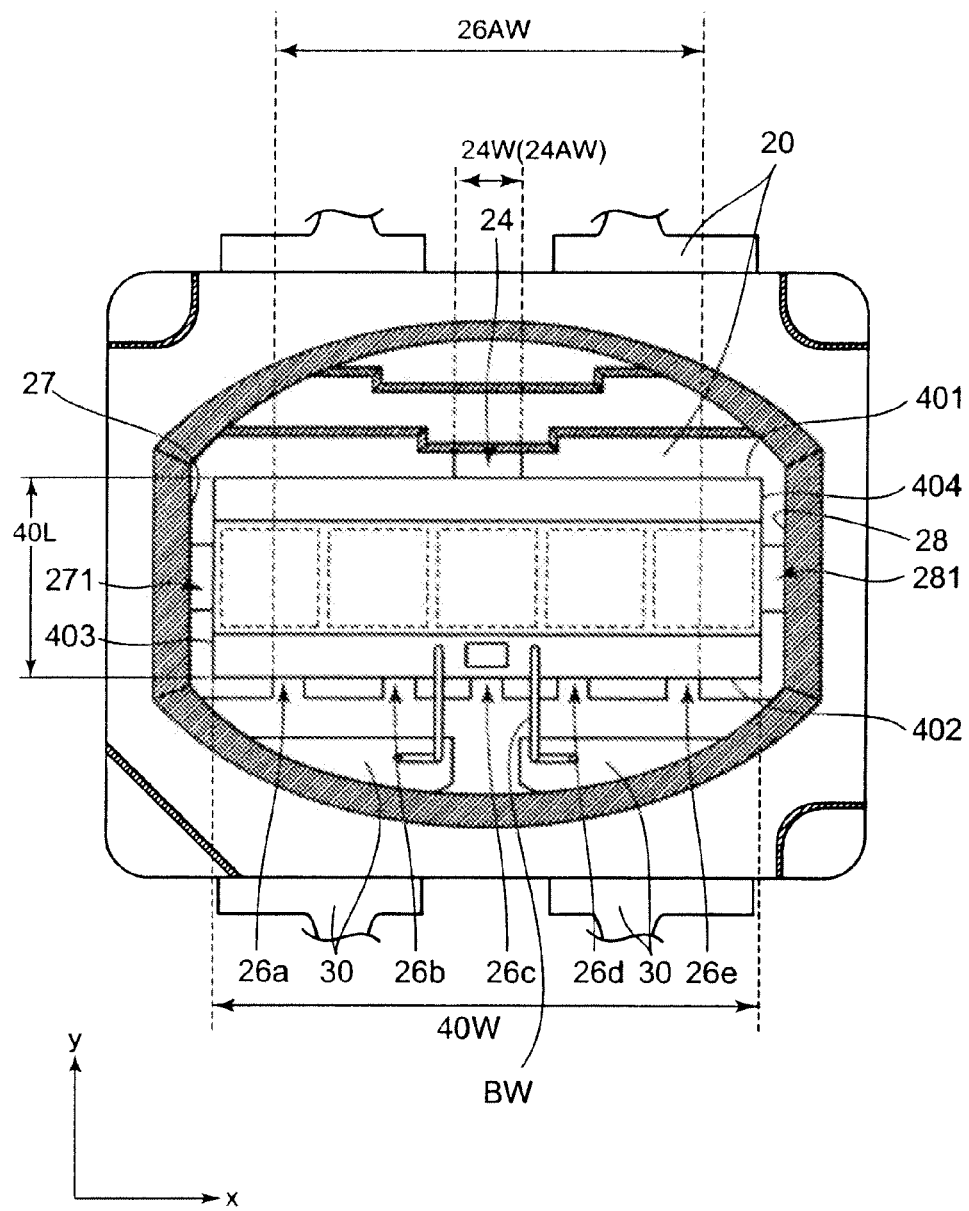
FIG. 7 is a front view illustrating a state that the light emitting component is mounted on the molded package illustrated in FIG. 6.

The exposed surface 21 of the first lead 20 further has a third edge portion 27 and a fourth edge portion 28 which are opposed to each other so as to put the mounting area 60 for the light emitting component 40 therebetween in a second direction perpendicular to the first direction (hereinafter referred to as "x direction" or "width direction" in the present specification). The third edge portion 27 and the fourth edge portion 28 extends in a direction crossing the first edge portion 23 and the second edge portion 25. In FIGS. 6 and 7, the third edge portion 27 and the fourth edge portion 28 are almost perpendicular to the first edge portion 23 and the second edge portion 25 but may be, not limited thereto, inclined with respect to the first edge portion 23 and the second edge portion 25. The third edge portion 27 and the fourth edge portion 28 are straight lines in parallel with the y direction except for a third cutout 271 and a fourth cutout 281 but may be, not limited thereto, for example, edge portions inclined with respect to the y direction or curved edge portions.

In the present embodiment, the third edge portion 27 can be equipped with one or more third cutouts 271 and the fourth edge portion 28 can be equipped with one or more fourth cutouts 281 (FIG. 6 illustrates one cutout for each edge portion). Preferable width 60W of the mounting area 60 for the light emitting component 40 is a value equal to or more than a distance between the third cutout 271 and the fourth cutout 281 and less than a distance between the third edge portion 27 and the fourth edge portion 28.

The "distance between the third cutout 271 and the fourth cutout 281" means a distance from a top portion 271t of the third cutout 271 to the top portion 281t of the fourth cutout 281. When there is a plurality of third cutouts 271, the cutout 271 having a top portion 271t nearest to the fourth edge portion 28 is to be referred to. Similarly, in a case where there is a plurality of fourth cutouts 281, the fourth cutout 281 having the top portion 281t nearest to the third edge portion 27 is to be referred to. The third cutout 27 and the fourth cutout 28 are filled with molded resin 11.

The third cutout 271 and the fourth cutout 281 also contribute to the self-alignment of the light emitting component 40 as similar to the above described first cutout 24 and the second cutouts 26. Conceptually, the light emitting component 40 is self-aligned such that a center line between the third side 402 and the fourth side 404 of the light emitting component 40 matches a center line between the third cutout 271 of the third edge portion 27 and the fourth cutout 281 of the fourth edge portion 28 in order to minimize the surface of the molten solder.

The width 40W of the light emitting component 40 (which is equal to the width 60W of the mounting area 60) is set to a value equal to or more than a distance between the third cutout 271 and the fourth cutout 281 and less than a distance between the third edge portion 27 and the fourth edge portion 28. Therefore, the top portion 271t of the third cutout 271 comes to lie flush with the third side 403 of the light emitting component 40 or the top portion 271t comes to be positioned underside of the light emitting component 40. Similarly, the top portion 281t of the fourth cutout 281 comes to lie flush with the fourth side 404 of the light emitting component 40 or the top portion 281t comes to be positioned underside of the light emitting component 40. As described above, the molten solder deforms such that the surface tension thereof becomes minimum. Therefore, the third side 403 of the light emitting component 40 is applied with stress such that the distance between the third side 403 and the top portion 271t of the third cutout 271 becomes shorter. On the other hand, the fourth side 404 of the light emitting component 40 is applied with stress such that the distance between the fourth side 404 and the top portion 281t of the fourth cutout 281 becomes shorter. As a result, the light emitting component 40 is self-aligned with a position (i.e., the mounting area 60) at which the both sides 403 and 404 balance the stress applied from the molten solder (see, FIG. 7).

According to the reasons as described above, setting the width 60W of the mounting area 60 to a value equal to or more than the distance between the third cutout 271 and the fourth cutout 281 and less than the distance between the third edge portion 27 and the fourth edge portion 28 enables an accurate self-alignment of the position of the light emitting component 40 in the width direction (i.e., the x direction) to the mounting position 60 for mounting.

In the present embodiment, the first lead 20 is provided with the third cutout 271 and the fourth cutout 281. However, in a case where the width 60W of the mounting area 60 is often changed (i.e., in a case where the width 60W of the mounting area 60 is corresponded to the width 40W of the light emitting component 40 different from that of the mounting area 60), the third cutout 271 and the fourth cutout 281 can be formed in conformity with the light emitting component 40 having the minimum width 40W. Accordingly, in the light emitting component 40 having the minimum width, positions of the third cutout 271 and the fourth cutout 281 become optimum positions with respect to the third side and the fourth side of the light emitting component 40 and, in the light emitting component 40 having wider width 40W, since the top portion 271t of the third cutout 271 and the top portion 281t of the fourth cutout 281 are positioned underside of the light emitting component 40. Therefore, the self-alignment effect can be produced in the above described both cases of the light emitting component 40. However, the molded resin 11 exposing from the third cutout 271 and the fourth cutout 281 repels the molten solder, so that, in a case where the third cutout 271 and the fourth cutout 281 positioned underside of the light emitting component 40 have wide areas, a bonding strength between the light emitting component 40 and the first lead 20 is degraded. In such a case, the third cutout 271 and the fourth cutout 281 are not necessarily formed.

In the present embodiment, the solder paste such as Au—Sn paste, Sn—Ag paste, Sn—Ag—Cu paste, Sn—Ag—Cu—Bi paste, Sn—Ag—Bi—In paste, Sn—Ag—Bi—In paste, Sn—Bi—Ag paste, Sn—Bi paste, Cu paste, Sn—Cu—Ni paste, Sn—Sb paste and the like can be used.

A sealing resin 52 seals the recess portion 12 of the molded resin 11 accommodating the light emitting component 40 and thereby protecting the light emitting component 40 from the outer environment. The sealing resin 52 can be formed into a single layer but can be formed into a multilayer (e.g., a double layer formed of an under film 521 and an over coat 522). A silicone resin, an epoxy resin, an acrylic resin, or a resin containing at least one of these resins can be used as a material of the sealing resin. Light scattering particles such as titanium oxide, silicon dioxide, titanium dioxide, zirconium dioxide, aluminum oxide, and aluminum nitride may be scattered in the sealing resin 52.

A wavelength conversion member 51 is formed of a glass or resin containing a material (e.g., phosphor) for converting a wavelength of light emitted from a light emitting element 42 of the light emitting component 40 and is fixed on a top surface of the light emitting element 42 in the present embodiment. For example, in a light emitting device 50 for emitting, for example, white light, the light emitting element 42 for emitting blue light can be combined with a wavelength conversion member 51 for emitting yellow light by absorbing the blue light (e.g., YAG glass formed such that YAG is dispersed in a glass).

Figure 8:
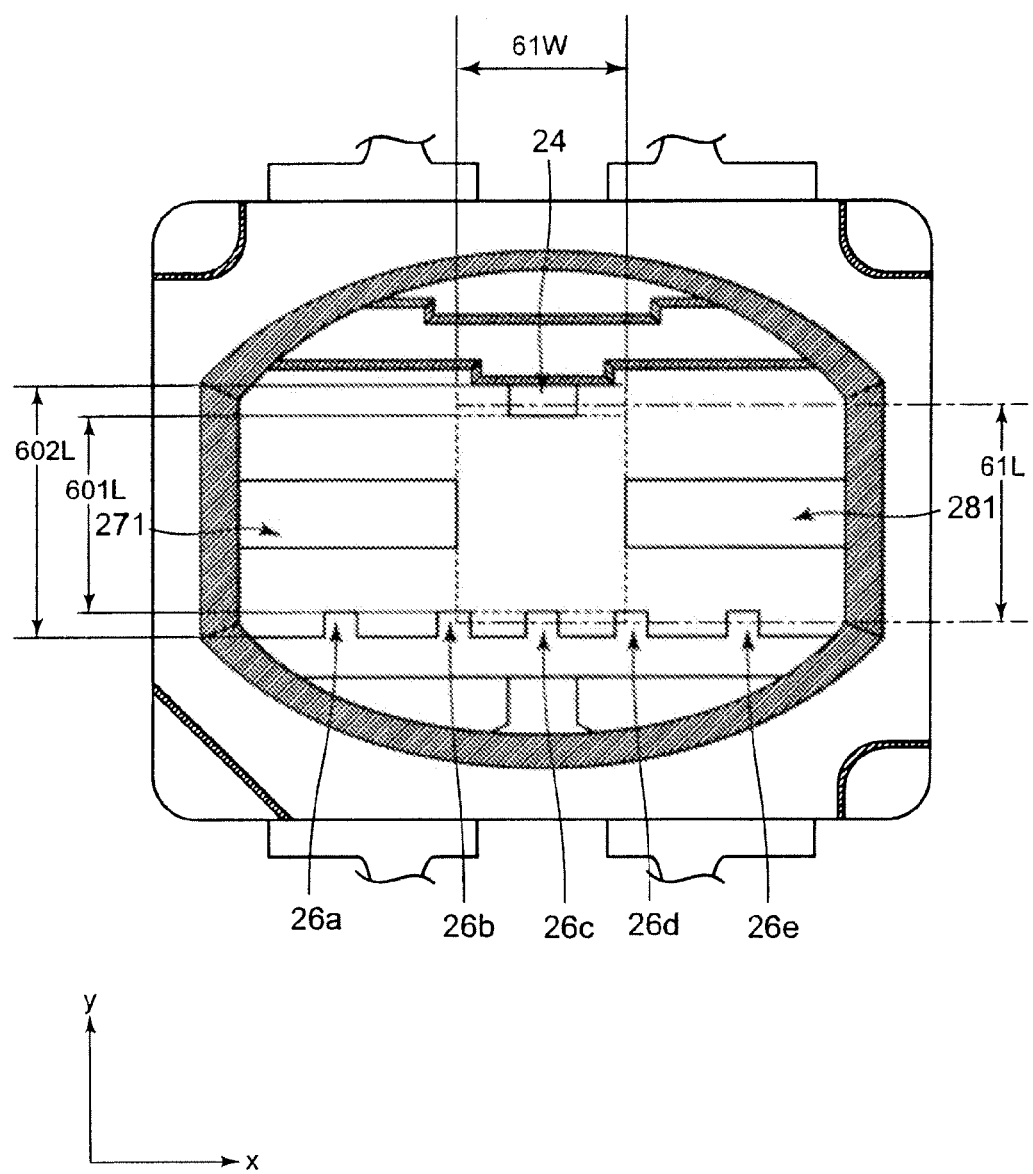
FIG. 8 is a front view of the molded package used in another light emitting device.
Figure 9:
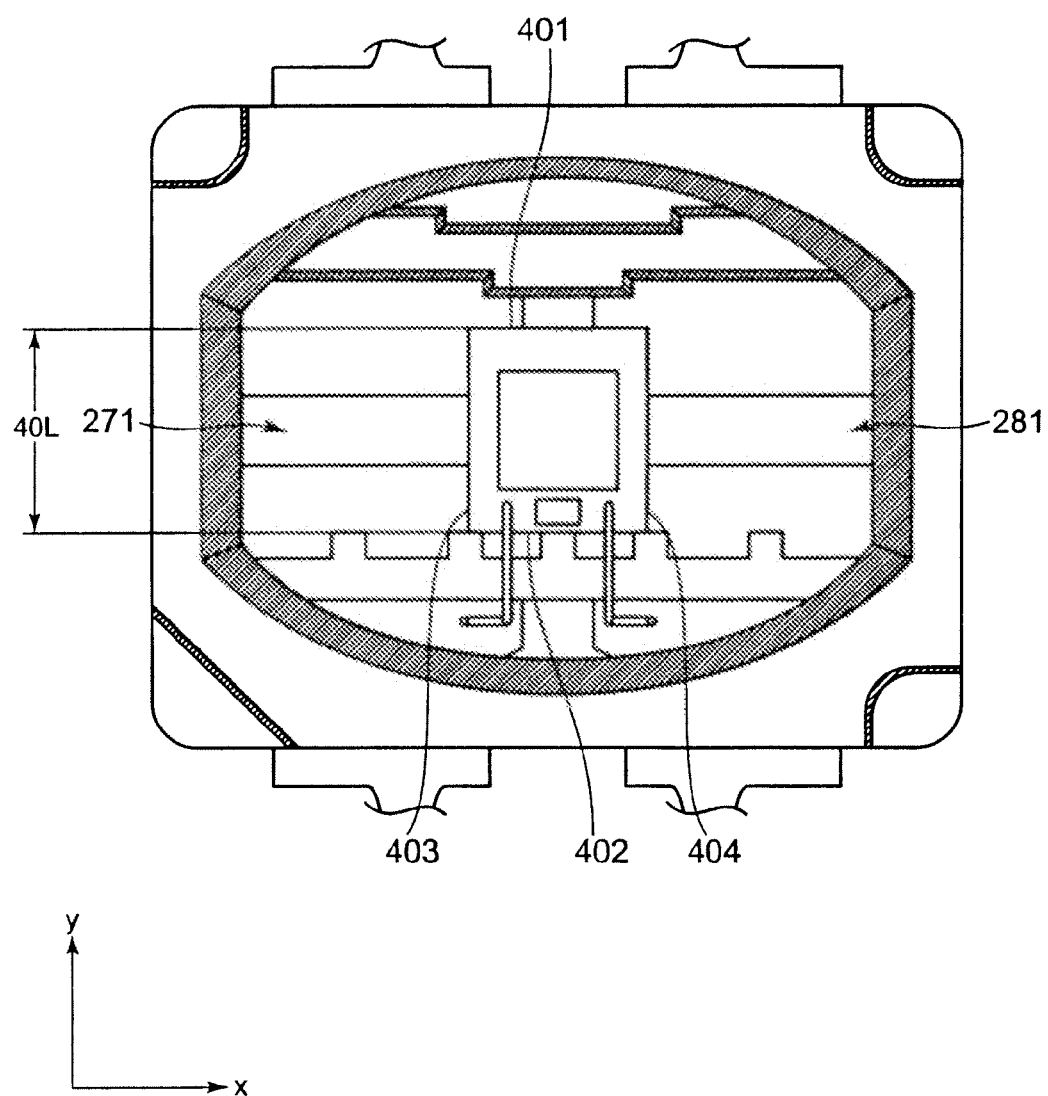
FIG. 9 is a front view illustrating a state that the light emitting component is mounted on the molded package illustrated in FIG. 8.

FIG. 8 illustrates a mounting area 60 (61) of the light emitting component 40 including one light emitting element 42. A length 61L of the mounting area 61 (i.e., a size in the y direction) is, similar to a length 60L of the mounting area 60 illustrated in FIG. 6, set to a value equal to or more than a distance 601L and less than a distance 602L. On the other hand, a width 61W of the mounting area 61 is set to a value about one fifth of the width 60W of the mounting area 60 illustrated in FIG. 6. This is because the light emitting elementsubmount 41 having a width corresponding to the number of the light emitting elementelements 42 is used in order to align a plurality of the light emitting elements along with the width direction (i.e., the x direction) (see, FIGS. 7 and 9).

As illustrated in FIG. 8, preferably, two of the plurality of second cutouts 26 (26b and 26d) are positioned in corners of the mounting area 61. When the light emitting component 40 is mounted on the mounting area 61, the second cutout 26b affects on a lower-left corner of the light emitting component 40. That is, the second cutout 26b achieves the self-alignment of the second side 402 of the light emitting component 40 in the y direction and the self-alignment of the third side 403 in the x direction can be carried out.

Similarly, the second cutout 26d affects on a lower-right corner of the light emitting component 40. That is, the second cutout 26d achieves the self-alignment of the second side 402 of the light emitting component 40 in the y direction and the self-alignment of the fourth side 404 in the x direction.

As described above, two of the second cutouts 26 (i.e., 26b and 26d) are positioned in the corners of the mounting area 61, so that the light emitting component 40 can be self-aligned not only in the y direction but also in the x direction. However, in a case where more specific self-alignment is required, it is desirable to provide the third cutout 271 and the fourth cutout 281 to the third edge portion 27 and the fourth edge portion 28, respectively.

The positioning of the two of the second cutouts 26 in the corners of the mounting area 61 produces an effect to prevent the light emitting component 40 from rotating.

Because of the following reasons, the first cutout 24 has, preferably, a width 24W in the range from 0.2 mm to 1.2 mm, more preferably, a width 24W of in the range from 0.6 mm to 0.9 mm.

As shown in FIG. 6, in the exposed surface 21 of the first lead 20, a portion exposed from a space between the first edge portion 23 of the first lead 20 and the mounting area 60 functions as a "first reservoir" for reversing the solder. For example, an excessive solder residing between the first lead 20 and the light emitting component 40 can be discharged into the first reservoir, so that a proper amount of solder can be left between the first lead 20 and the light emitting component 40. As a result, the solder can be made into a uniform thickness and, therefore, a horizontal mounting of the light emitting component 40 can be achieved.

The first reservoir is divided into two areas in a width direction by the first cutout 24, so that, when the width 24W of the first cutout 24 becomes wider, the first reservoir becomes narrower. As a result an amount of solder reserved therein decreases. When the width 24W of the first cutout 24 is set to a value equal to or less than 1.2 mm, an enough area of the reservoir can be secured. Consequently, the excessive solder can be discharged from the area between the first lead 20 and the light emitting component 40 at a satisfactory level. As a result, the light emitting component 40 can be horizontally mounted.

On the other hand, the first cutout 24 contributes to the self-alignment of the light emitting component 40 of the side of the first edge portion 23. When the width 24W of the first cutout 24 becomes narrower, the self-alignment effect decreases. If the width 24W of the first cutout 24 is set to a value equal to or more than 0.2 mm, the self-alignment effect preferably increases.

As described above, if the width 24W of the first cutout 24 is set to a value of in the range from 0.2 mm to 1.2 mm, the effect that the light emitting component 40 can be horizontally mounted can be produced and also the self-alignment effect of the light emitting component 40 can be improved.

Preferably, the width 24W of the first cutout 24 is narrower than the width 60W of the mounting area 60 for the light emitting component 40. If the width 24W of the first cutout 24 is made narrower than the width 60W of the mounting area 60, a side corresponding to the first side 401 of the light emitting component 40 in the mounting area 60 contacts the "first reservoir" for reserving the solder. Therefore, the excessive solder existing residing between the first lead 20 and the light emitting component 40 mounted on the mounting area 60 for the first lead 20 can be smoothly discharged into the first reservoir through the side corresponding to the first side 401 of the light emitting component 40 in the mounting area 60.

More preferably, if the width 24W of the first cutout 24 is a value equal to or less than 55% of the width 40W of the light emitting component 40, more preferably, a value equal to or less than 30% thereof, since a contact portion between the first reservoir and the mounting area 60 on which the light emitting component 40 is mounted increases, the excessive solder can be more smoothly discharged from the space between the light emitting component 40 and the first lead 20.

Because of the following reasons, a preferable width 26W of the second cutouts 26 is a value of in the range from 0.2 mm to 0.9 mm, more preferably, in the range from 0.2 mm to 0.5 mm.

A portion of the exposed surface 21 of the first lead 20 exposed from a space between the second edge portion 25 of the first lead 20 and the mounting area 60 functions as a "second reservoir" for reserving the solder. The width 26W equal to or less than 0.9 mm makes an area of the second reservoir wider, so that the excessive solder discharged from between the first lead 20 and the light emitting component 40 can be prevented from overflowing across the molded resin 11 filling between the first lead 20 and the second lead 30 and reaching into the second lead 30. Accordingly, the solder can be prevented from adhering to the exposed surfaces 31 of the second lead 30, and as a result, a defective connection between the second lead 30 and the bonding wires BW can be suppressed. In addition, it can be suppressed to short-circuit between the first lead 20 and the second lead 30 by the excessive solder. The exposed surfaces 31 of the second lead 30 can be prevented from being contaminated with the solder paste. Since the second reservoir is narrower than the first reservoir of a side of the first edge portion 24, most of the solder is discharged to the first reservoir.

When the light emitting component 40 is mounted on the solder paste, the solder paste may be extruded from the first lead 20 to sometimes reach a surface of the molded resin 11 filling between the first lead 20 and the second lead 30. By the subsequent reflow, the molten solder naturally gather on the exposed surface 21 of the first lead 20 since the molten solder has low wettability to the molded resin 11. However, in some cases, the molten solder may stay on the molded resin 11 to form a solder ball SB thereon (see, FIGS. 23 to 25). If the solder ball SB moves onto the second lead 30 and adheres to the exposed surfaces 31 of the second lead 30 during manufacturing process of the light emitting device, there is a possibility to cause a defective connection between the second lead 30 and the bonding wire BW. If the width 26W of the second cutouts 26 is set to a value equal to or less than 0.9 mm, the molten solder tends to be drawn to the first lead 20 on the molded resin 11 and thus the solder ball SB can be prevented from being formed. Such an effect is more preferred in a case where the second edge portion 25 of the exposed surface 21 of the first lead 20 is opposed to the edge portion of the exposed surfaces 31 of the second lead 30 as in the present embodiment.

On the other hand, the second cutouts 26 contribute to the self-alignment of the light emitting component 40 of a side of the second edge portion 25. When the width 26W of the second cutouts 26 becomes narrower, the self-alignment effect decreases. Therefore, when the width 26W of the second cutouts 26 is set to a value equal to or more than 0.2 mm, the self-alignment effect becomes preferably higher.

As described above, with the width 26W of the second cutouts 26 of in the range from 0.2 mm to 0.9 mm, the exposed surfaces 31 of the second lead 30 can be prevented from being contaminated, the first lead 20 and the second lead 30 are prevented from causing a short-circuit, and the self-alignment effect of the light emitting component 40 can be improved.

The molded package 10 in which first edge portion 23 of the exposed surface 21 of the first lead 20 is opposed to the edge portion of the exposed surfaces 31 of the second lead 30 is also encompassed within the scope of the present invention. However, if the second edge portion 25 of the exposed surface 21 of the first lead 20 is opposed to the edge portions of the exposed surfaces 31 of the second lead 30, an advantageous effect that the solder ball SB is prevented from being formed on the surface of the molded resin 11 exposed from the space between the first lead 20 and the second lead 30 can be produced.

With reference to FIG. 7 again, a width 24AW of an area on which the first cutout 24 is formed is preferably narrower than a width 26AW of an area on which the second cutouts 26 are formed.

The "width 26AW of the area on which the plurality of the second cutouts 26 are formed" is a width of the whole area on which the second cutouts 26 are formed in the second edge portion 25. As exemplified in FIG. 7, the "width 26AW of the area" is a width of the whole area on which five second cutouts 26a to 26e are formed.

The "width 24AW of the area on which the first cutout 24 is formed" is a width of the whole area where the first cutout 24 is formed on the first edge portion 23. Since only one first cutout 24 is formed on the present invention, the width 24AW of the area is equal to e the width 24W of the first cutout 24.

In order to produce the self-alignment effect for each light emitting component 40 having different width 40W (i.e., a size in the x direction), the plurality of second cutouts 26 are preferred to be formed throughout the second edge portion 25 of the first lead 20. More preferably, two of the plurality of second cutouts 26 are positioned on corners of each light emitting component 40 having different width 40W. That is, the width 26AW of the area is preferably made wider.

On the other hand, in order to secure a wide area for the "first reservoir" for reserving the solder, the width 24W of the first cutout 24 is preferably made narrower. That is, the width 24AW (corresponding to the width 24W) of the area is preferably made narrower.

As described above, in a case where the width 24AW of the area on which the first cutout 24 is formed is made narrower than the width 26AW of the area on which the second cutouts 26 are formed, the self-alignment effect can be produced with respect to the light emitting component 40 having various width 40W. Also, the area of the first reservoir into which the excessive solder residing in the space between the first lead 20 and the light emitting component 40 is discharged can be kept wider.

Figure 10:
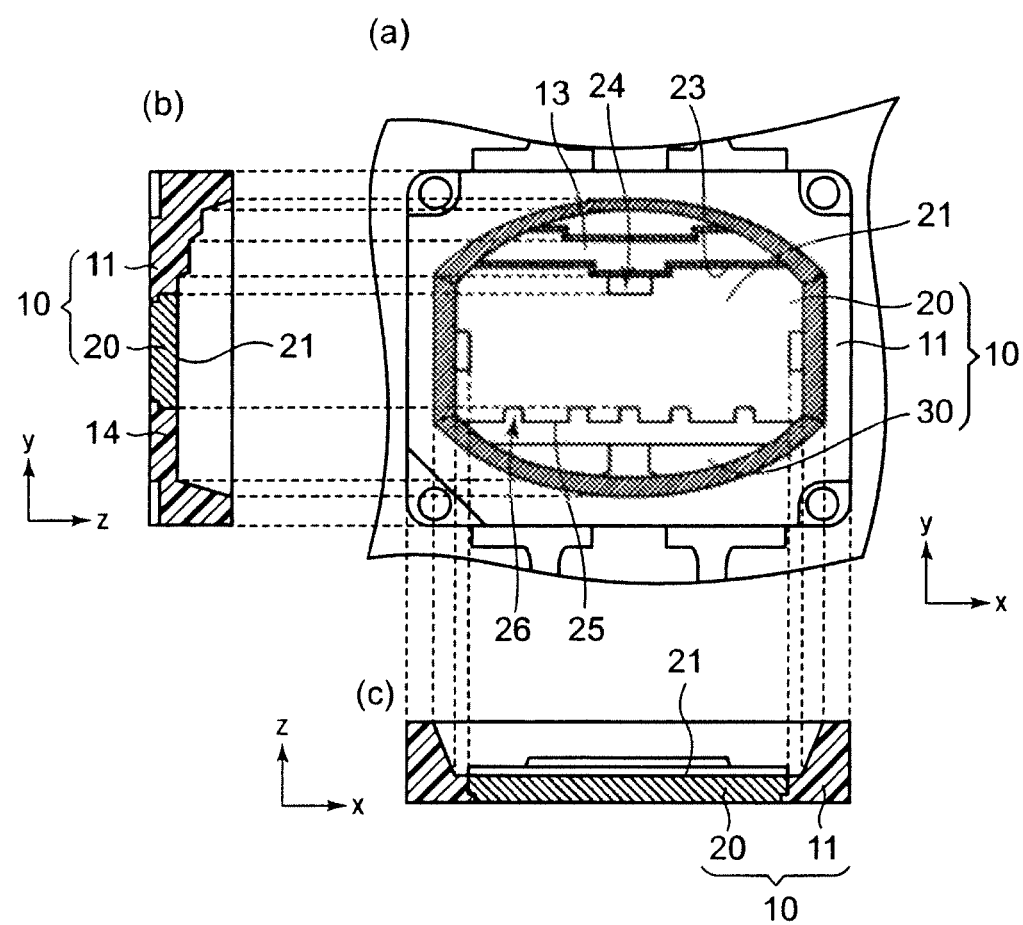
FIG. 10(a) is a front view of the packaged mold.
FIGS. 10(b) and 10(c) are a cross sectional view of the molded package, respectively.
Figure 11:
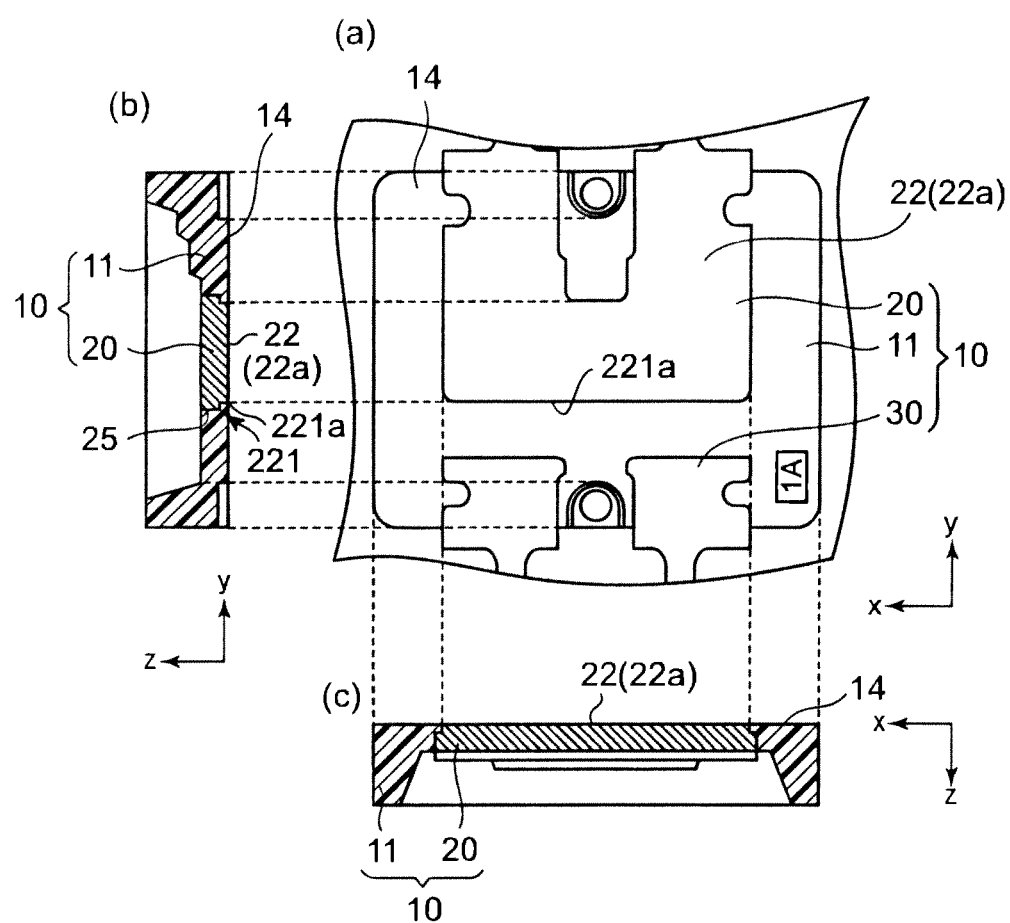
FIG. 11(a) is a rear side view of the molded package.
FIGS. 11(b) and 11(c) are a cross sectional view of the molded package, respectively.

As illustrated in FIGS. 10 and 11, the first lead 20 and the second lead 30 are preferably exposed from a rear surface 14 of the molded package 10. Accordingly, generation of heat in the light emitting component 40 can be effectively released to the outside of the recess portion 12 via the first lead 20 and the second lead 30. However, if the first lead 20 and the second lead 30 are exposed to the rear surface 14, when the sealing resin 52 is filled in the recess portion 12, the sealing resin 52 may be leaked to the rear surface 14 of the molded package 10 climbing down along a boundary surface between the first lead 20 and the molded resin 11 and a boundary surface between the second lead 30 and the molded resin 11.

Since the first lead 20 is provided with the cutouts 24, 26, 271, and 281 formed thereon, the edge portions 23, 25, 27, and 28 of the first lead 20 becomes longer. Specifically, the second edge portion 25 in which a plurality of second cutouts 26 are formed becomes considerably longer. Therefore, a boundary surface between the second edge portion 25 and the molded resin 11 increases. The boundary surface may be a path through which the sealing resin 52 may leak to the rear surface 14 of the molded package 10, so that the leakage of the sealing resin 52 becomes susceptible due to the increase of the boundary surface.

It is preferable that the rear surface 22 of the first lead 20 is exposed from the rear surface 14 of the molded package 10 but the second cutouts 26 are not exposed therefrom in order to suppress the increase of the boundary surface due to the second cutouts 26. That is, the second cutouts 26 are preferably covered with the molded resin or a covering member at the rear surface 14 of the molded package 10. Since the increase of the boundary surface between the second cutouts 26 and the molded resin 11 can be suppressed, the leakage of the sealing resin 52 thus can be suppressed.

Figure 12:
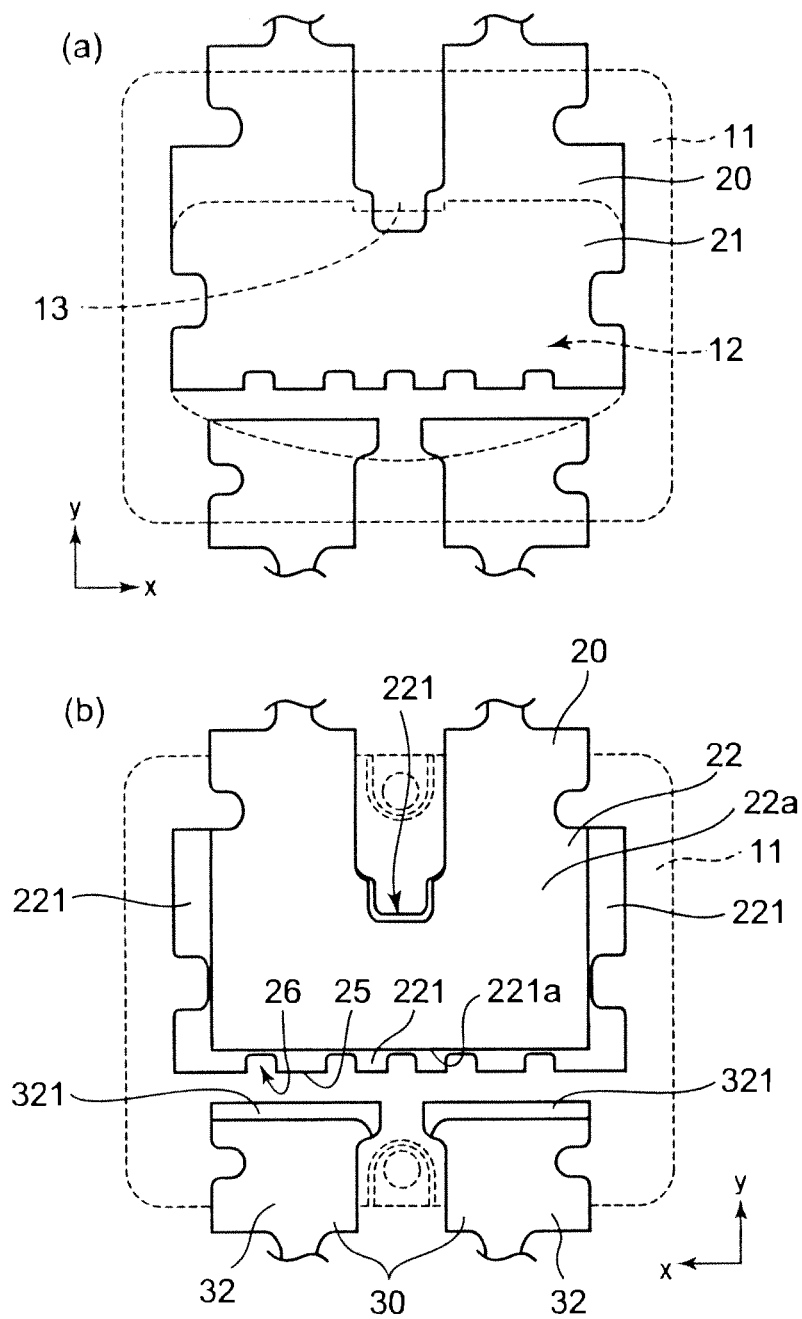
FIG. 12(a) is a front view of a first lead and second lead used in the molded package illustrated in FIG. 10.
FIG. 12(b) is a rear side view of the first lead and the second lead.
Figure 14:
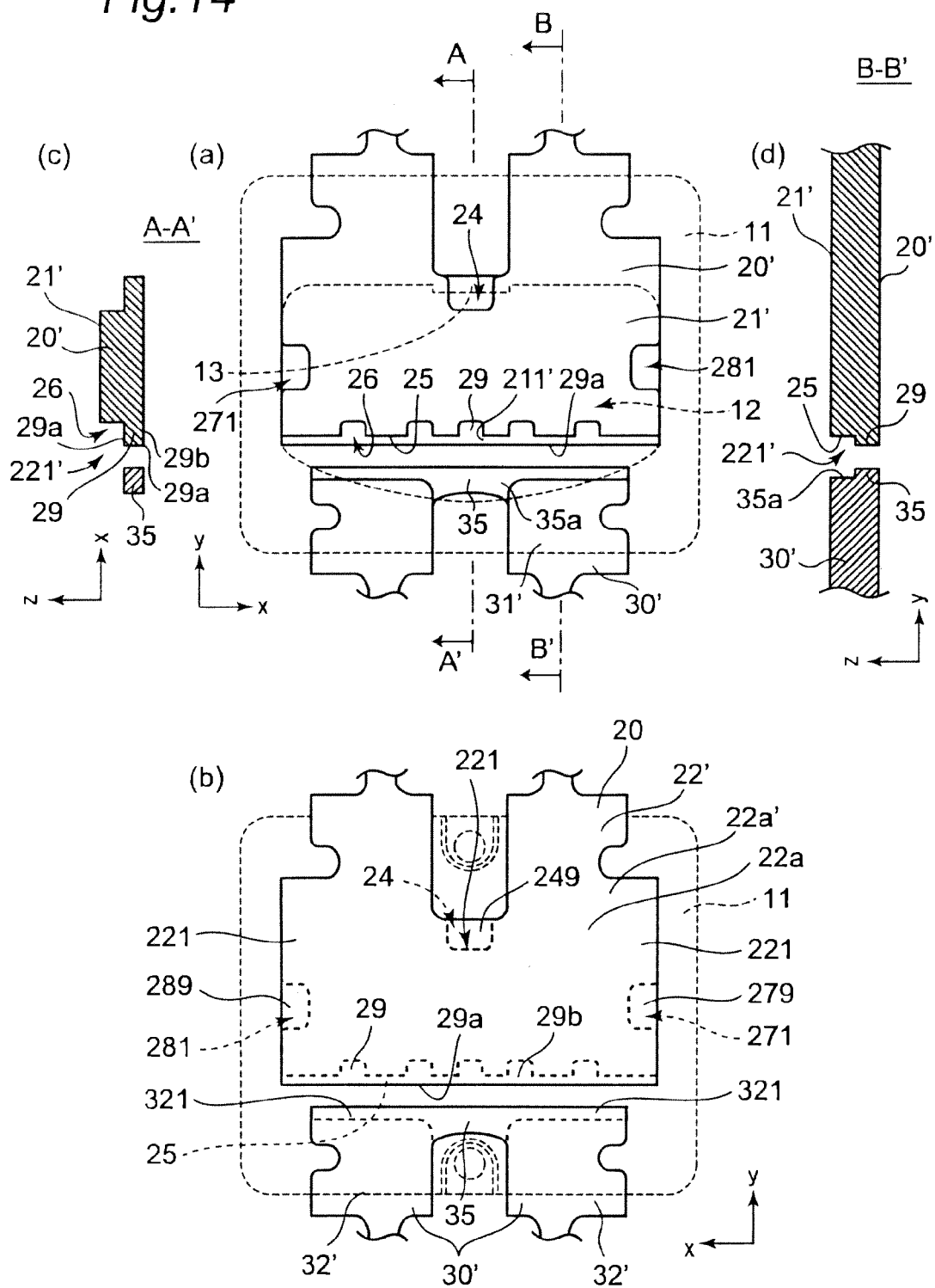
FIG. 14(a) is a front view illustrating the first lead and the second lead to be used in another molded package.
FIG. 14(b) is a rear side view illustrating the first lead and the second lead.
FIG. 14(c) is a cross-sectional view taken along a line A-A' in FIG. 14(a).
FIG. 14(d) is a cross-sectional view taken along a line B-B' in FIG. 14(a).

For example, the first lead 20 as illustrated in FIG. 12 or a first lead 20' as illustrated in FIG. 14 may be used in order to prevent the second cutouts 26 from being exposed from the rear surface 14 of the molded package 10.

The first lead 20 illustrated in FIG. 12 will be described below.

In the first lead 20 illustrated in FIG. 12(b), a step 221 is provided between the second edge portion 25 and the second cutouts 26 at a side of the rear surface 22 of the first lead 20. When forming the molded package 10, the step 221 is filled with the molded resin 11 (see, FIG. 11(b)). As a result, when observing from the side of the rear surface 14 of the molded package 10, most of the rear surface 22 of the first lead 20 is exposed (i.e., an exposed rear surface 22a), but the second cutouts 26 are not exposed (see, FIG. 11(a)). As seen from FIGS. 11(a) and 11(b), an edge portion 221a of the step 221 positioned in the y direction more than the second edge portion 25 becomes a boundary line between the first lead 20 and the molded resin 11 at a side of the rear surface 14 of the molded package 10.

As illustrated in FIG. 12(b), the second cutouts 26 of the first lead 20 are positioned at a side of the second lead 30 (i.e., −y direction) than the exposed rear surface 22a of the first lead 20. That is, the second cutouts 26 are positioned between the second lead 30 and the exposed rear surface 22a of the first lead 20. This is because the step 221 is provided on the rear surface 22 of the lead 20 and a portion, therefore a part of the rear surface 22 is not exposed. As a result, an area of the exposed rear surface 22a gets smaller due to the step 221. The exposed rear surface 22a of the first lead 20 becomes narrower than before the step 221 is provided thereon.

The first lead as illustrated in FIG. 12 is advantageous to be applied to wire bonding.

When the first lead 20 and the second lead 30 are disposed, the second edge portion 25 of the first lead 20 becomes closest to the second lead 30. Therefore, the second edge portion 25 of the first lead 20 should be spaced apart from the second lead 30 in order to avoid short circuit between the first lead 20 and the second lead 30.

As wider the space between the second edge portion 25 of the first lead 20 and the second lead 30, a distance between the mounting area 60 for receiving the light emitting component 40 (see, FIG. 6) and the second lead 30 becomes more away. Therefore, long bonding wires BW are required for connecting between the light emitting component 40 and the second lead 30.

In the present embodiment, the second edge portion 25 can be placed closer to the second lead 30 as far as they do not contact to each other, so that lengths of the bonding wires BW to be used can be advantageously suppressed.

Positioning of the second edge portion 25 closer to a side of the second lead 30 enables the second edge portion 25 to move in the −y direction, so that a size of the exposed surface 21 of the first lead 20 in the −y direction can be made larger. In other words, since the distance 602L between the first edge portion 23 and the second edge portion 25 (see, FIG. 6) becomes longer, the length 60L of the mounting area 60 in the y direction can be made longer. Accordingly, without changing an outer size of the molded package 10 and the recess portion 12, a size of the light emitting component 40 mountable therein in the y direction can be made as large as possible.

A first lead 20' illustrated in FIG. 14 will be described below.

The first lead 20' illustrated in FIG. 14 is provided with extending portions 29 extending from the second cutouts 26 and the second edge portion 25 to the second lead 30 (i.e., −y direction) on the side of the rear surface 22' of the first lead 20'. When observing from the side of the rear surface 22' of the first lead 20', the second cutouts 26 and the second edge portion 25 are covered by the extending portions 29 (see, FIG. 14(b)). Therefore, when the molded package 10 is formed by using the first lead 20', even if the rear surface 22' of the first lead 20' is exposed from the rear surface 14 of the molded package 10, the second cutouts 26 will not be exposed (see, FIG. 16A).

Figure 16:
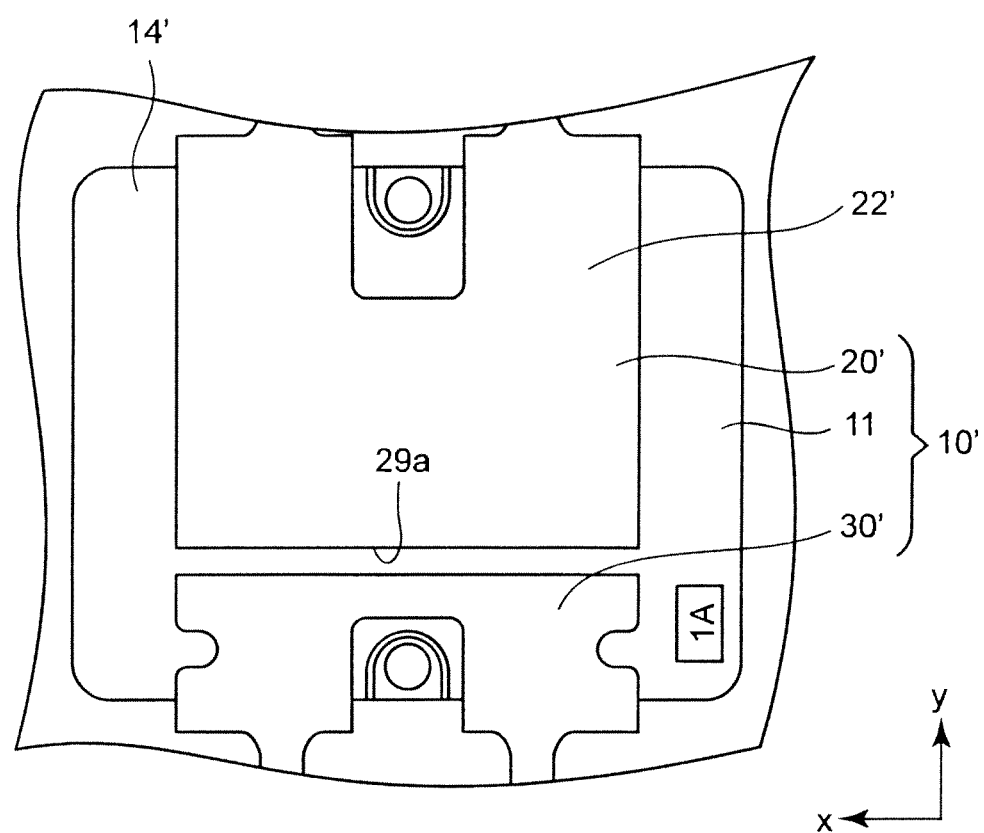
FIG. 16 is a rear side view of the molded package including the first lead and the second lead of FIG. 16.

As illustrated in FIGS. 14(a) and 16, an edge portion 29a of the extending portions 29 which is positioned on a side of second lead 30' than the second edge portion 25 (i.e., −y direction) becomes a boundary line between the first lead 20' and the molded resin 11 at the rear surface 14' of the molded package 10'. Therefore, the exposed rear surface 22a' of the first lead 20' becomes wider by the extending portions 29 comparing to a case before providing the extending portions 29.

The exposed rear surface 22a' functions as a heat discharge surface for discharging heat from the light emitting component 40, so that the wider the exposed rear surface 22a', the better the heat discharge property. Consequently, with the first lead 20' illustrated in FIG. 14, a molded package 10' excellent in heat discharge property can be obtained.

Figure 15:
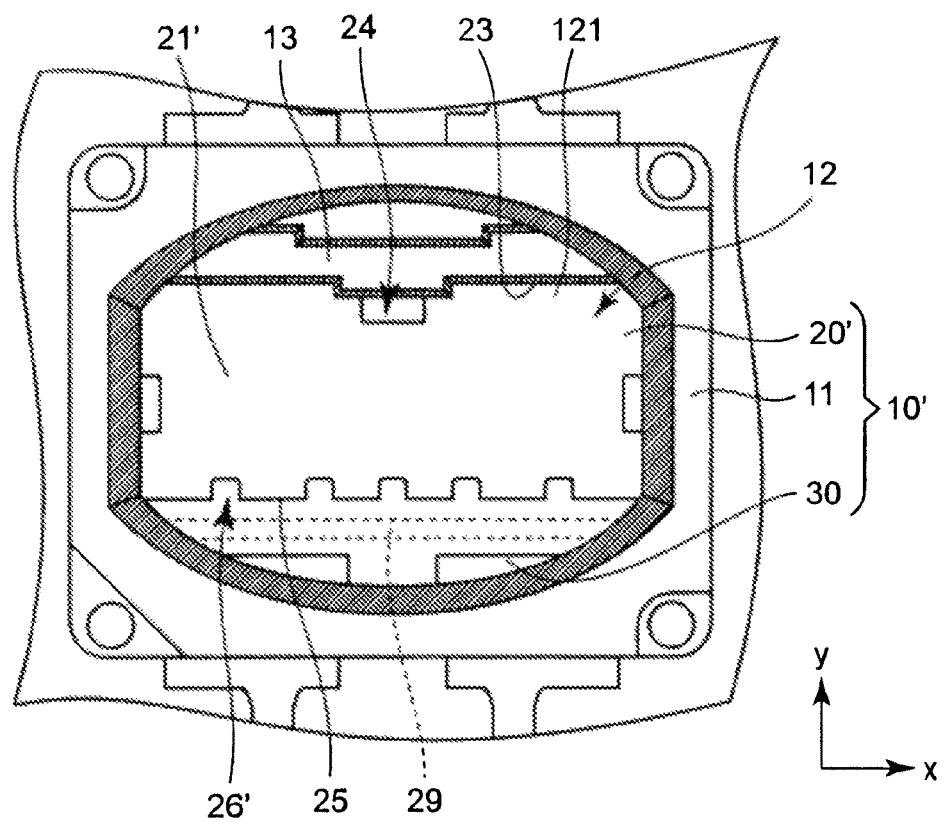
FIG. 15 is a front view of the molded package including the first lead and the second lead of FIG. 14.

As illustrated in FIGS. 14(c) and 14(d), the extending portions 29 are made thinner than the first lead 20'. Therefore, a step 211' appears between the second cutouts 26 and the second edge portion 25 and a surface 29c of the extending portions 29 on the side of the exposed surface 21' of the first lead 20'. When forming the molded package 10, the step 211' is filled with the molded resin 11. Accordingly, when observing the bottom surface 121 of the recess portion 12 of the molded package 10', the extending portions 29 are not exposed but an irregular boundary line between the second cutouts 26 and the second edge portion 25 and the molded resin 11 appears (see, FIG. 15). In this regard, the molded package 10' of FIG. 15 has the self-alignment effect of the light emitting component 40 owing to the second cutouts 26 in a similar manner as the case of the molded package 10 illustrated in FIG. 10.

When the first lead 20' and the second lead 30' are disposed in a manner as illustrated in FIG. 14, the edge portion 29a of the extending portions 29 of the first lead 20 becomes closest to the second lead 30. Therefore, in attempting to make the second edge portion 25 of the first lead 20 to be close to the second lead 30, the extending portions 29 contact with the second lead 30. Therefore, a distance between the second edge portion 25 and the second lead 30 is required to be wider than (the case of the first lead 20 of FIG. 12) in the first lead 20' of FIG. 14. Therefore, in terms of reducing an amount of use of the bonding wires BW in the wire bonding, the molded package 10 of FIG. 10 is more advantageous than the molded package 10' of FIG. 15.

In the first lead 20' of FIG. 14, the first cutout 24, the third cutout 217 and the fourth cutout 281 are covered by rear-side covering portions as well as the second cutouts 26 are covered by the extending portions 29 on the side of the rear surface 22'.

The first cutout 24 is covered by the rear-side covering portion 249 on the side of the rear surface 22' of the first lead 20'. Therefore, the first cutout 24 cannot be seen from the side of the rear surface 22' of the first lead 20'.

The rear-side covering portion 249 is thinner than the first lead 20'. Therefore, a step between a surface of the rear-side covering portion 249 and the exposed surface 21' of the first lead 20' are formed on the side of the exposed surface 21'. The step is filled with the molded resin 11 when the molded package 10' is formed. As a result, an uneven (i.e. U-shaped) boundary line is generated between the first cutout 24 and the molded resin 11 (see, FIG. 15) when observing form the bottom surface 121 of the recess portion 12. Therefore, the molded package 10' of FIG. 15 also has the self-alignment effect of the light emitting component 40 owing to the first cutout 24 in the similar manner as the case of the molded package 10 illustrated in FIG. 10.

Similarly, both of the third cutout 271 and the fourth cutout 281 are covered by the rear-side covering portions 279 and 289 on the side of the rear surface 22' of the first lead 20'. Therefore, the third cutout 271 and the fourth cutout 281 cannot be seen from the side of the rear surface 22' of the first lead 20'.

The rear-side covering portions 279 and 289 are thinner than the first lead 20' Therefore, steps between the surfaces of the rear-side covering portions 279 and 289 and the exposed surface 21' of the first lead 20' are formed on the side of the exposed surface 21'. The steps are filled with the molded resin 11 when the molded package 10' is formed. As a result, an uneven (i.e. U-shaped) boundary line is generated between the third cutout 271 and the molded resin 11 and also an uneven (i.e. U-shaped) boundary line is generated between the fourth cutout 281 and the molded resin 11 (see, FIG. 15). Therefore, the molded package 10' of FIG. 15 also has the self-alignment effect of the light emitting component 40 owing to the third cutout 271 and the fourth cutout 281 in a manner similar to the case of the molded package 10 of FIG. 10.

The second lead 30' of FIG. 14 is, different from the second lead 30 of FIG. 12 (which is made of two independent members), made of a single member. In the second lead 30' of FIG. 14, the two members are connected via the connecting portion to be formed into one piece. The connecting portion 35 is disposed on a side of the rear surface 32' of the second lead 30' and is thinner than the second lead 30'. Therefore, a step appears between a surface of the connecting portion 35 and the exposed surface 31' on the side of the exposed surface 31' of the second lead 30'. The step is filled with the molded resin 11 when the molded package 10' is formed. Therefore, when observing the bottom surface 121 of the recess portion 12 of the molded package 10', the connecting portion 35 is not exposed but is seen as if the second lead 30' is made of two members (see, FIG. 15). However, when observing the rear surface 14' of the molded package 10', it is known that the second lead 30' is an integral body (see, FIG. 16).

The second lead 30' of FIG. 14 is made into one piece by the connection portion 35, so that the second lead 30' has higher strength. Further, by covering a surface of the connecting portion 35 with the molded resin 11, a bonding strength between the second lead 30' and the molded resin 11 can be enhanced. On the other hand, since the connecting portion 35 needs to be made thinner than the second lead 30', the second lead 30' cannot be formed simply by stamping.

In the first lead shown in FIG. 14, the first cutout 24, the third cutout 271, and the fourth cutout 281 are covered by the rear-side covering portions 249, 279, and 289. However, the rear-side covering portion is not necessarily provided, or can be provided to only one or two of cutout(s).

The first lead 20 of FIG. 12 and the second lead 30 of FIG. 14 can be combined to form the molded package. Similarly, the first lead 20 of FIG. 14 and the second lead 30 of FIG. 12 can be combined to form the molded package.

As illustrated in FIG. 12, in order to prevent the sealing resin 52 from being leaked, steps 221 and 321 are provided on a periphery of a rear surface 22 of the first lead 20 and a periphery of a rear surface 32 of the second lead 30. Accordingly, a leakage path of the sealing resin 42 (i.e., a boundary surface between the lead and the molded resin 11) is made longer, so that the sealing resin 52 is hardly prevented from being leaked. However, the first cutout 24 lowers strength of the first lead 20, if the step 221 is provided to the entire periphery of the first cutout 24, the strength of the first lead 20 decreases more. To solve the above described problem, the step 221 is provided on the top portion 24t of the first cutout 24 and adjacent to the top portion 24t, thereby reducing an effect of strength decrease with respect to the first lead 20. Therefore, in the periphery of the first cutout 24, the leakage path of the sealing resin 42 is short except for the top portion 24t and adjacent thereto. In other words, the sealing resin 42 tends to leak into the rear surface 14 of the molded package 10 through the periphery of the first cutout 24.

In the present embodiment, a projecting portion 13 projecting into the recess portion 12 from an inner side surface 122 of the recess portion 12 of the molded resin 11 is provided to partially cover the first cutout 24 except for the top portion 24t (see, FIG. 12(a)). The projecting portion 13 seals the periphery of the first cutout 24 from an inside of the recess portion 12, so that the leakage of the sealing resin 52 from the periphery of the first cutout 24 can be effectively suppressed. The top portion 24t of the first cutout 24 is not covered by the projecting portion 13, so that the first cutout 24 would not inhibit the self-alignment effect of the light emitting component 40.

With the projecting portion 13, strength of the inner side surface 122 (specifically, a side of the first lead 20) of the molded resin 11 can be improved. In a final stage of the manufacturing process of the light emitting device 50, the first lead 20 is cut out from the lead frame. At the time, the first lead 20 gets flexed to apply stress to the molded resin 11. With the projecting portion 13, strength of the molded resin 11 improves and the molded resin 11 can bear the stress, thereby producing a detachment suppressing effect between the first lead and the molded resin and a breakage suppressing effect of the molded resin.

Figure 13:
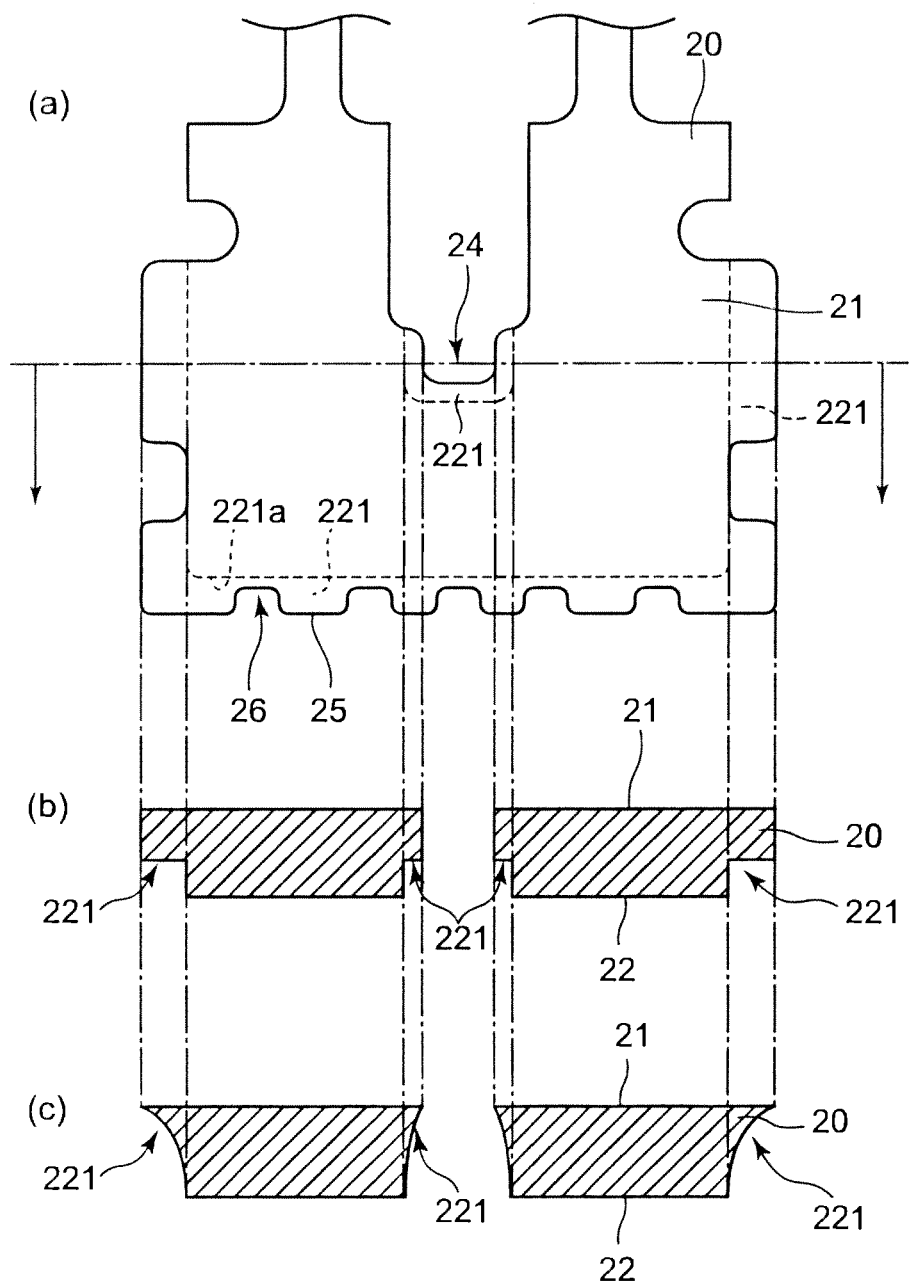
FIG. 13(a) is a front view of the first lead illustrated in FIG. 12.
FIGS. 13(b) and 13(c) are a cross sectional view of the first lead, respectively.

Desirably, the top portion 24t of the first cutout 24 exposing from the above described projecting portion 13 is provided with the step 221 on a side of the rear surface 22 of the first lead 20 in order to prevent the sealing resin 52 from being leaked (see, FIGS. 12(b) and 13). In the present specification, the "step" may be formed into a staircase shape as illustrated in FIG. 13(b) or may be formed into a curved step as illustrated in FIG. 13(c).

Manufacturing processes of the molded package 10, the light emitting component 40, and the light emitting device 50 of the present embodiment will be described below one by one.

<Manufacturing Process of Molded Package 10>

Figure 17:
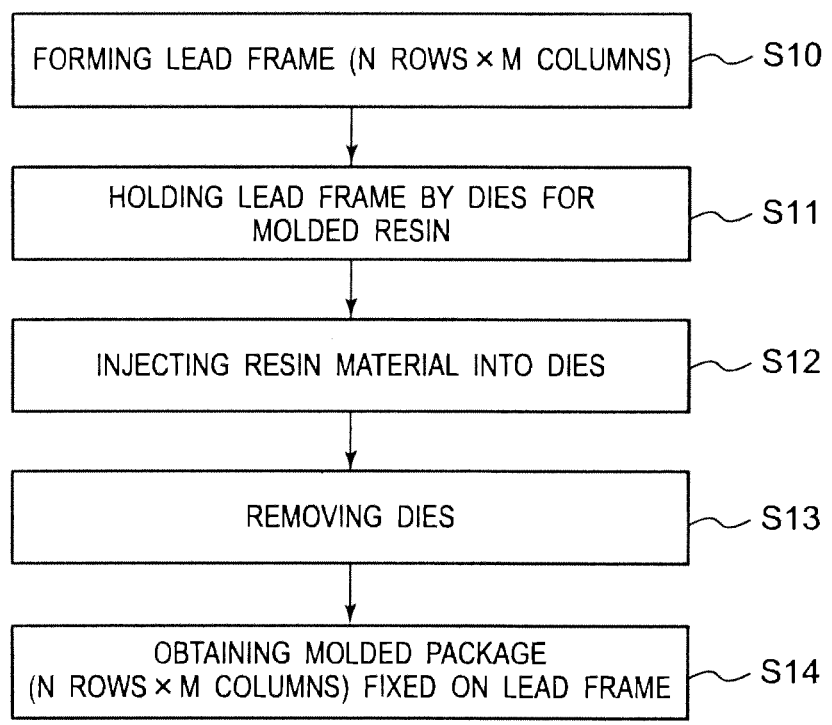
FIG. 17 is a flow chart illustrating a manufacturing process of the molded package.

A manufacturing process of the molded package 10 will be described below with reference to FIG. 17.

Figure 18:
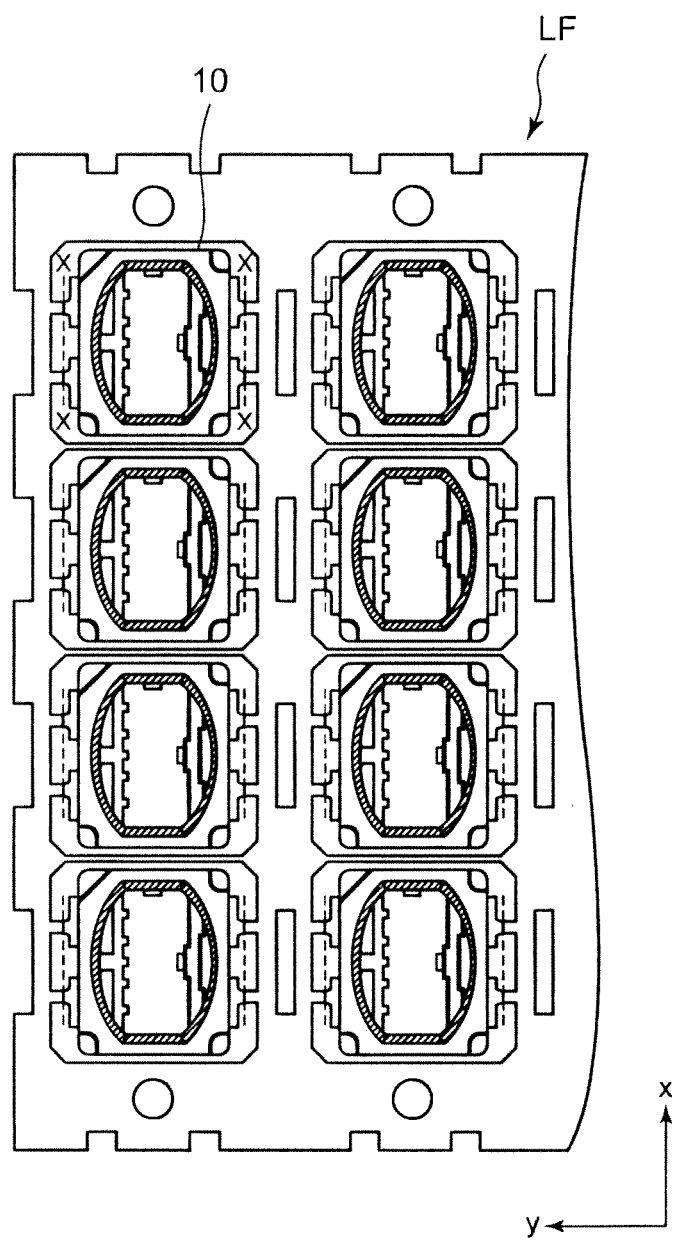
FIG. 18 is a front view illustrating the molded package fixed to a lead frame.

A lead frame LF formed with a plurality of the first leads 20 and the second leads 30 by punching a metal plate, the first leads 20 and the second leads 30 being paired to be faced to each other (S10). The step 221 of the first leads 20 and the step 321 of the second leads 30 are formed as needed. The steps 221, 321 can be formed by, but not be limited to, dry etching method, wet etching method, cutting process, embossing process and the like. In addition, the steps 221, 321 can be shaped in various cross-section shapes such as a stepwise shape shown in FIG. 13(b) and a curved shape shown in FIG. 13(c). Then, the lead frame LF is held at a position corresponding to each lead pair by using dies for molding having a cavity almost identical to the shape of the molded resin 11 (S11). Then, a resin material for molded resin 11 is injected into the cavity of the dies (S12). When the dies are removed after curing the resin material (S13), as illustrated in FIG. 18, the molded packages 10 fixed on the lead frame LF can be obtained (S14).

<Manufacturing Process of Light Emitting Component 40>

Figure 19:
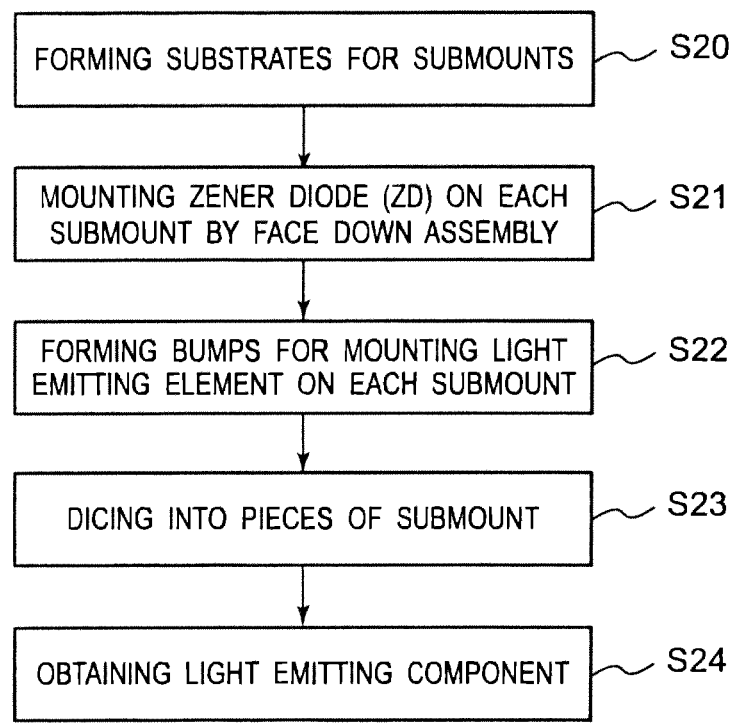
FIG. 19 is a flow chart illustrating a manufacturing process of the light emitting component.

A manufacturing process of the light emitting component 40 will be described below with reference to FIGS. 19 and 20.

Firstly, as illustrated in FIG. 20(b), a substrate SF before dividing the submounts 41 into pieces is formed (S20). FIG. 20(a) illustrates the submount 41 obtained by dividing the substrate of FIG. 20(b) into a piece corresponding to each light emitting component. The submount 41 is provided with metal lines for mounting one zener diode (ZD) 43 and five light emitting elements 42. Bumps for mounting the zener diode 43 is formed on each submount 41 and the zener diode 43 is mounted thereon by a face down (i.e. flip-chip) assembly (S21). Then, bumps for mounting the light emitting element(s) 42 (e.g., a LED) is formed on each submount 41 and the light emitting element (s) 42 is mounted thereon by a face down (i.e. flip-chip) assembly (S22). Finally, the submount frame SF is diced to be divided into pieces (S23), thereby obtaining the light emitting component 40 (S24). In the example of FIG. 19, the light emitting component 40 including five light emitting elements 42 aligned in the x direction (see, FIG. 5).

Figure 21:
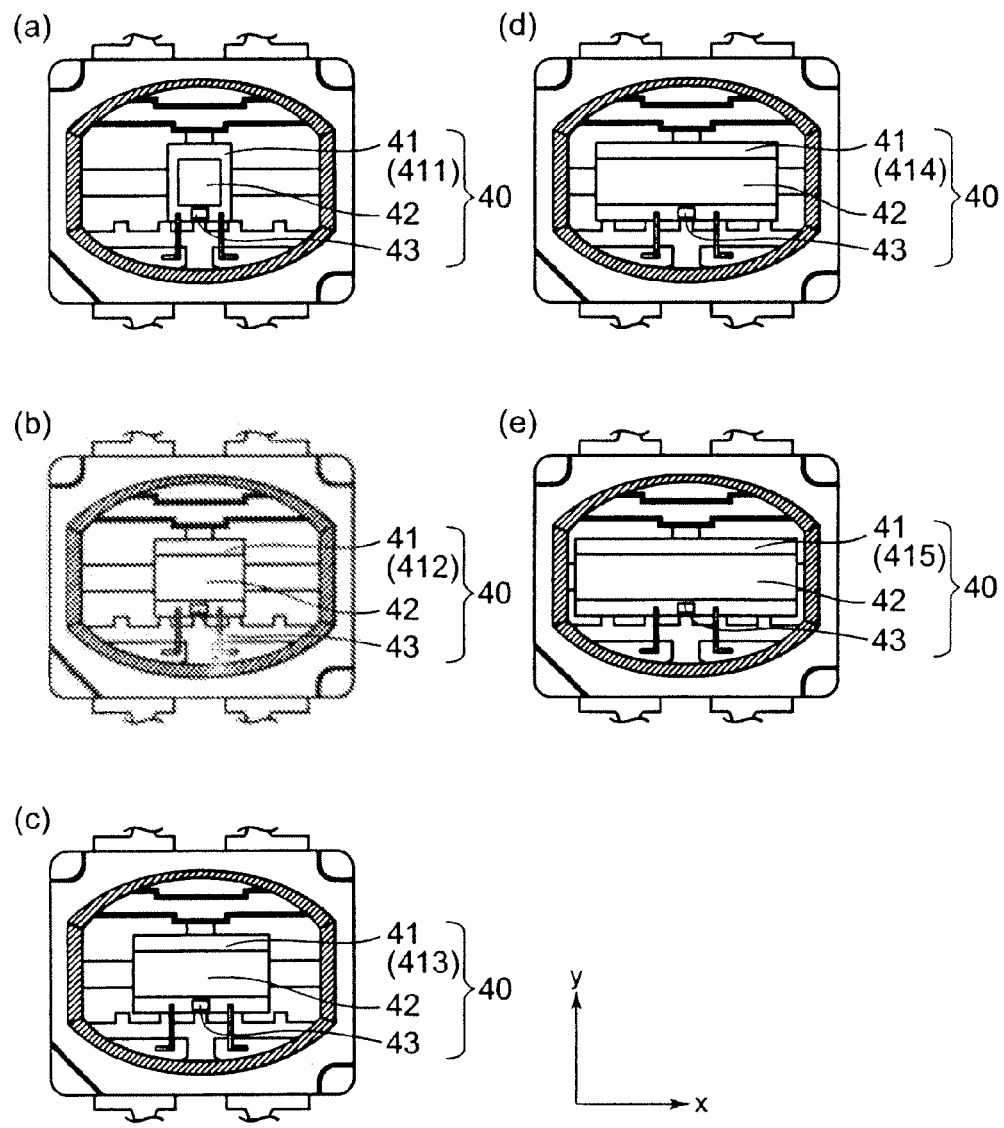
FIGS. 21(a) to 21(e) are a front view of the light emitting device according to the present embodiment, respectively.

Preferably, the shape of the submount 41 is appropriately changed corresponding to the number of light emitting elements 42 to be mounted thereon. For example, as illustrated in FIG. 21, in the light emitting component 40 including one light emitting element 42, a submount 411 having a width matching a size of the singular light emitting element 42, i.e., "the light emitting element 42"×1, is used. Similarly, a submount 412 having a width corresponding to a size of two light emitting elements 42, i.e., "the light emitting element 42"×2, a submount 413 having a width corresponding to a size of three light emitting elements 42, i.e., "the light emitting element 42"×3, a submount 414 having a width corresponding to a size of four light emitting elements 42, i.e., "the light emitting element 42"×4, a submount 415 having a width corresponding to a size of five light emitting elements 42, i.e., "the light emitting element 42"×5, are appropriately used.

<Manufacturing Process of Light Emitting Device 50>

Figure 22:
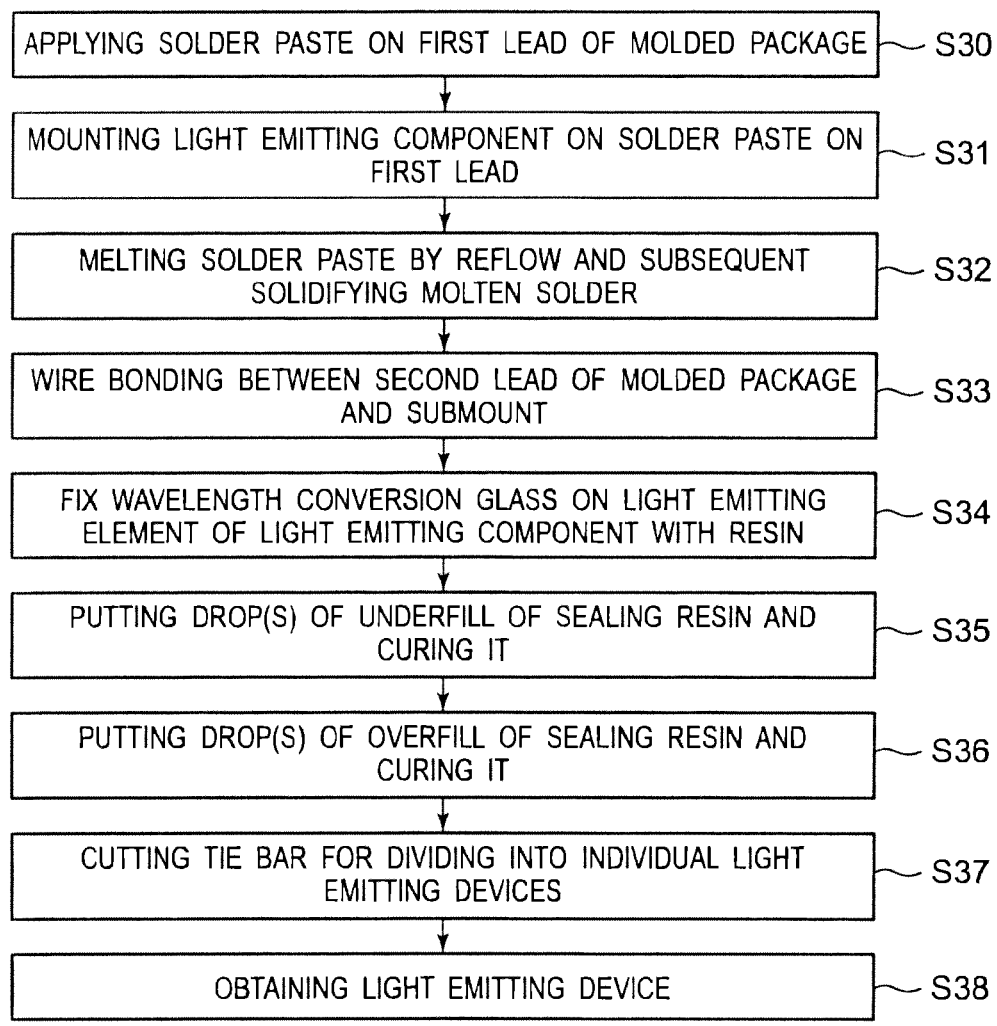
FIG. 22 is a flow chart illustrating a manufacturing process of the light emitting device.

A manufacturing process of the light emitting device 50 will described below with reference to FIG. 22.

Figure 23:
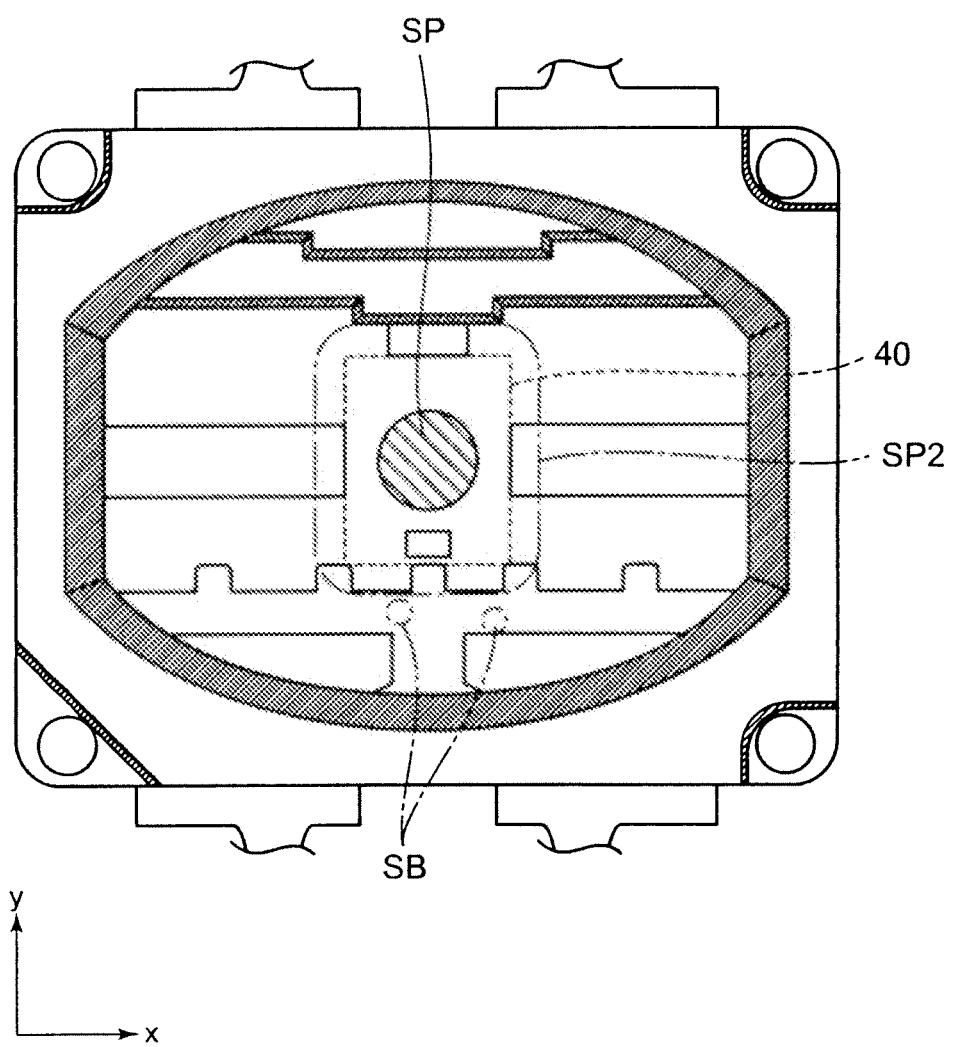
FIG. 23 is a front view illustrating that solder paste is applied to the molded package used in the light emitting device illustrated in FIG. 21(a).
Figure 24:
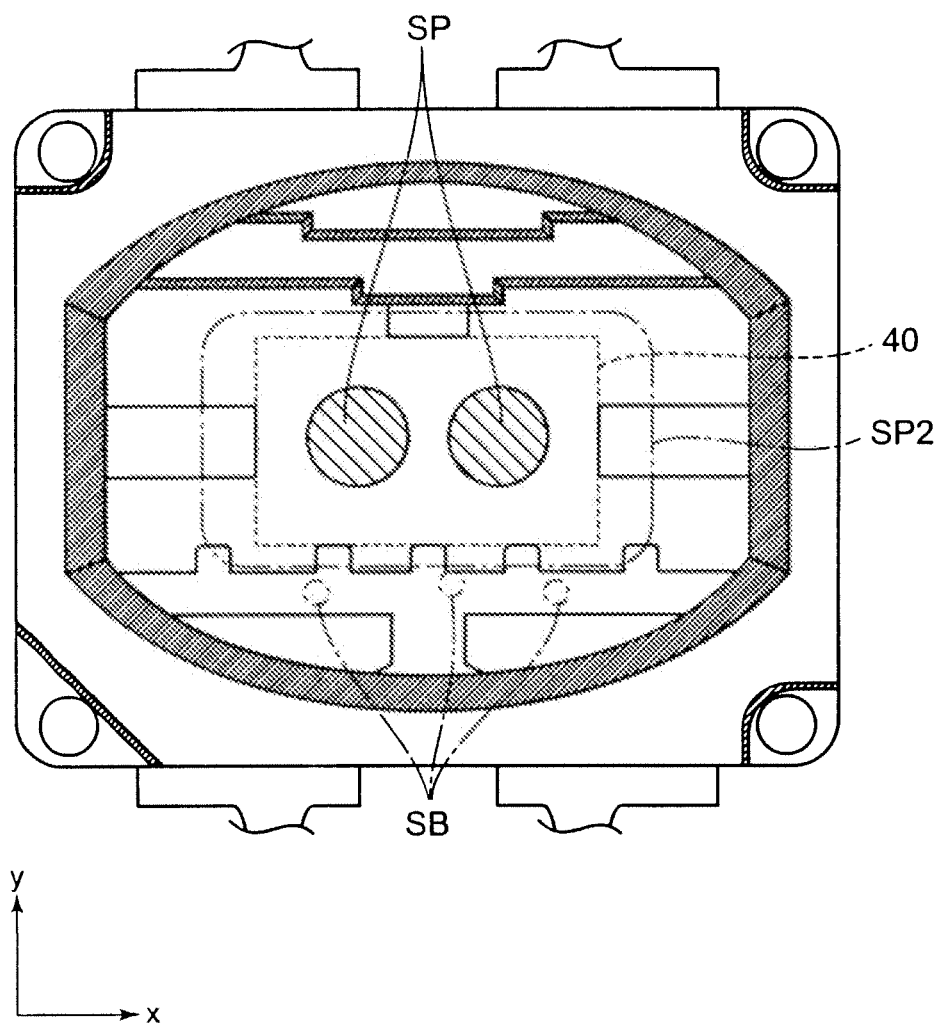
FIG. 24 is a front view illustrating that the solder paste is applied to the molded package used in the light emitting device illustrated in FIG. 21(c).
Figure 25:
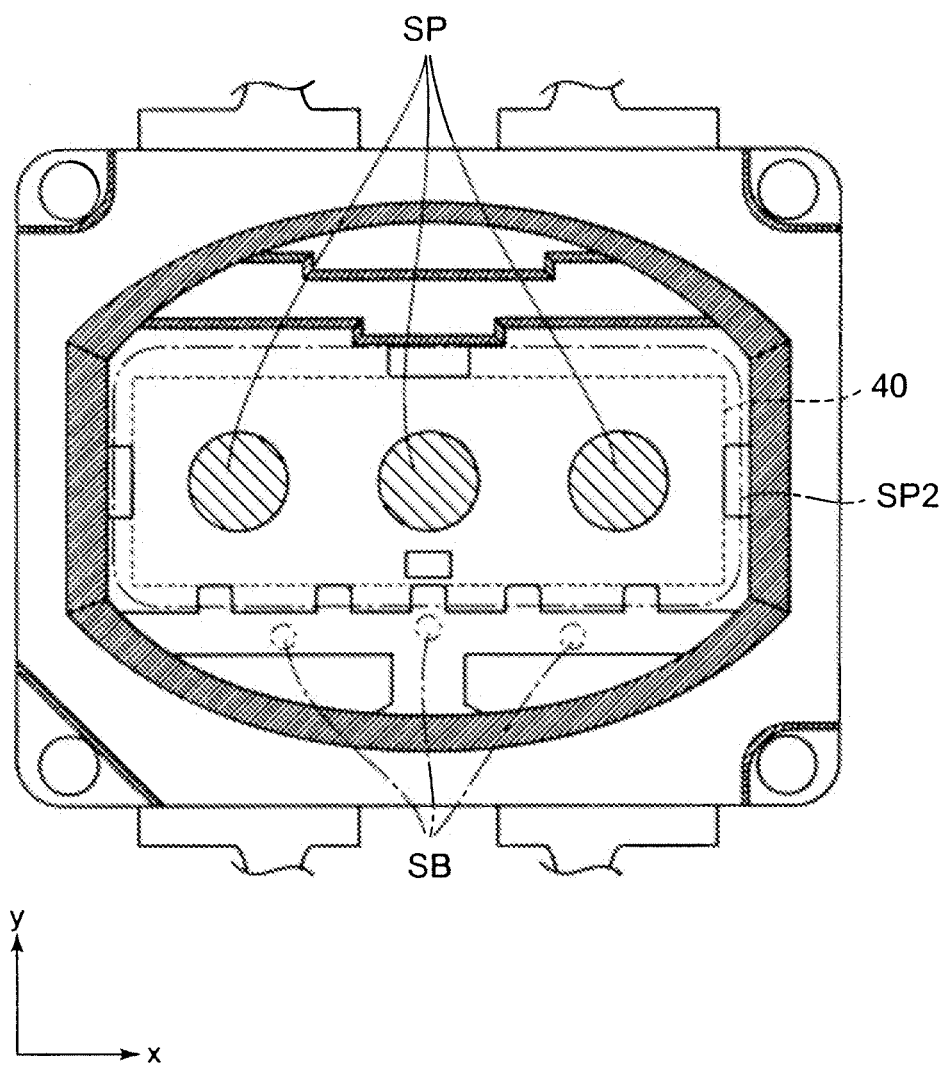
FIG. 25 is a front view illustrating that the solder paste is applied to the molded package used in the light emitting device illustrated in FIG. 21(e).

The first lead 20 of the molded package 10 manufactured according to the above described process is applied with solder paste SP (S30). An amount of the solder paste SP is adjusted according to the width of the light emitting component 40 to be mounted. For example, FIG. 23 illustrates an example of applying the solder paste SP for the light emitting component 40 including one light emitting element 42. FIG. 24 illustrates an example of applying the solder paste SP for the light emitting component 40 including three light emitting elements 42. FIG. 25 illustrates an example of applying the solder paste SP for the light emitting component 40 including five light emitting elements 42. Then, the light emitting component 40 is mounted on the exposed surface 21 of the first lead 20 via the solder paste SP (S31). As a result, the solder paste SP is pressed by the light emitting component 40 to be spread. Therefore, the solder paste SP is located on at least a part of bottom surface 121 of the recess portion 12 of the molded resin 11 of the molded package 10, the part of the bottom surface 121 consisting of the exposed surface of the first lead 20, a surface area of the molded resin 11 filling the first cutout 24 formed on the first edge portion 23 of the first lead 20, and another surface area of the molded resin 11 filling the plurality of second cutouts 26 formed on the second edge portion 25 of the first lead 20. Then, the solder paste SP is molten by the reflow (i.e., by heating), followed by solidifying a molten solder (S32). Accordingly, the solder paste spread over a resin surface becomes the molten solder and gathers on the surface of the first lead 20, and the light emitting component 40 is self-aligned on the mounting area 60. The light emitting component 40 is mounted on the mounting area 60 by solidifying the molten solder.

Then, second lead 30 of the molded package 10 is wire-bonded with the submount 41 via the bonding wires BW to electrically connect between the light emitting component 40 and the exposed surfaces 31 of the second lead 30 (S33). The wavelength conversion glass 51 is fixed on the light emitting element 42 of the light emitting component 40 with a resin (S34). Then, a drop(s) of an uncured first sealing resin (i.e., an underfill material) 521 is put on the recess portion 12 and cured to form the first sealing resin 521 (S35). Subsequently, a drop(s) of an uncured second sealing resin (i.e., an overfill material) 522 is put on the recess portion 12 and cured form the second sealing resin 522 (S36). Accordingly, the sealing resin 52 is formed.

Tie bars of the lead frame LF illustrated in FIG. 18 are cut along lines X-X to divide a plurality of light emitting device 50 fixed on the lead frame LF into individual light emitting devices 50 (S37). As a result, the plurality of light emitting devices 50 is obtained (S38).

In the molded packages 10 and 10' of the present embodiment, the first cutout 24 and the plurality of second cutouts 26 enable the precise self-alignment and mounting of the light emitting component 40. The self-alignment effect is obtainable independent from the size of the light emitting component 40 in the x direction. Therefore, in the molded packages 10 and 10' of the present invention, each of the light emitting components having different sizes can be precisely mounted on the mounting area.

<Second Embodiment>

The present embodiment relates to a molded package capable of achieving the second object of the present invention and a light emitting device using the same.

In the present embodiment, disclosed is the molded package in which the light emitting component can be mounted by the selfalignment and the sealing resin for sealing the light emitting component can be prevented from being leaked to the rear surface and the light emitting device utilizing thereof.

Figure 26:
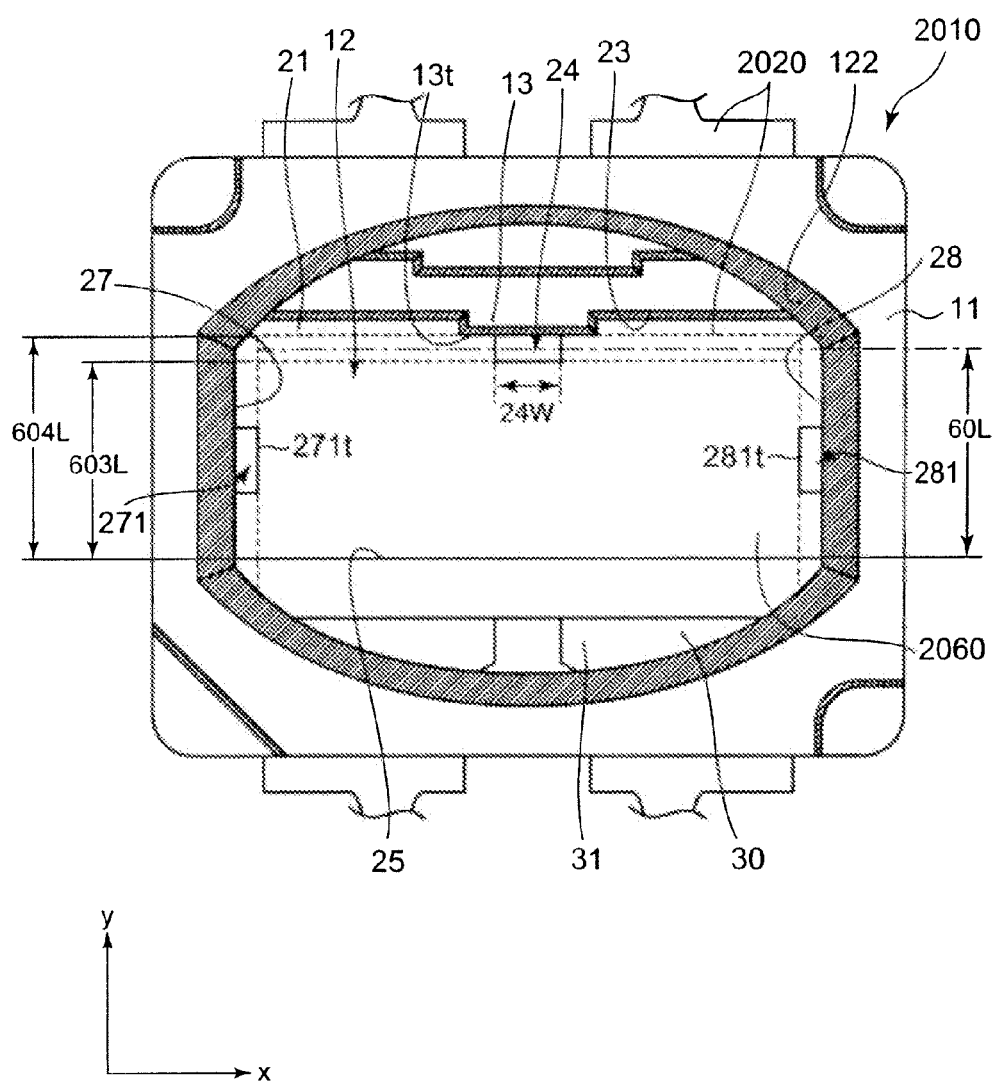
FIG. 26 is a front view of the molded package according to a second embodiment.
Figure 27:
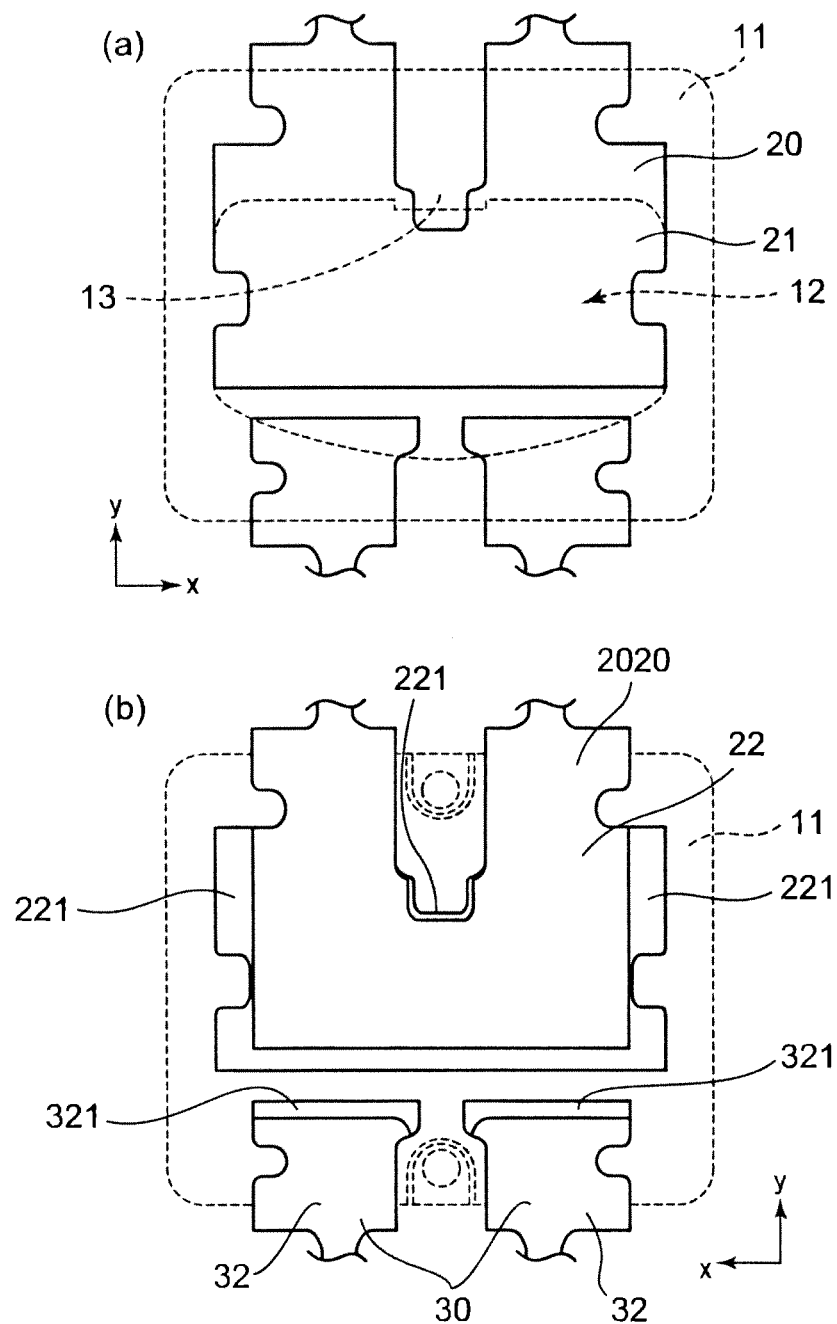
FIG. 27(a) is a front view illustrating the first lead and the second lead to be used in the molded package of FIG. 26.
FIG. 27(b) is a rear side view illustrating the first lead and the second lead.
Figure 28:
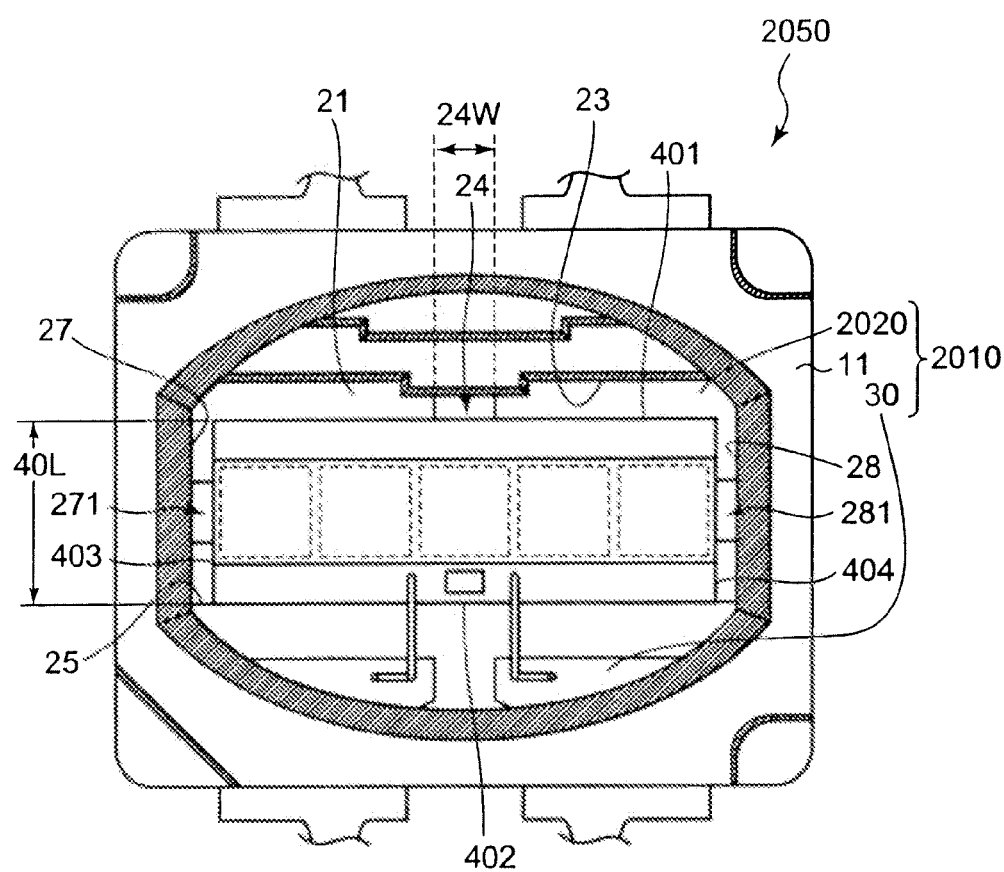
FIG. 28 is a front view illustrating a state before the light emitting device using the molded package of FIG. 26 is sealed with the sealing resin.

In a molded package 2010 of the present embodiment illustrated in FIGS. 26 to 28 having the projecting portion 13 as an essential configuration, the molded resin 11 of the molded package 2010 projects toward the inside of the recess portion 12 from the first edge portion 23. A first lead 2020 is always exposed from a rear surface of the molded package 2010. The second edge portion 25 of the first lead 2020 is not provided with the second cutouts. The present embodiment differs from the first embodiment in the above points. The other points are similar to those of the first embodiment.

As it is illustrated in FIG. 26, in the molded package 2010 of the present embodiment, an exposed surface 21 of the first lead 2020 has the first edge portion 23 and the second edge portion 25 which are opposed to each other so as to put a mounting area 2060 for the light emitting component 40 therebetween in the first direction (i.e., in the y direction).

The first lead 2020 has the singular first cutout 24 in the first edge portion 23. FIG. 26 illustrates only one first cutout 24 but a plurality of first cutouts 24 may be formed. The first cutout 24 is filled with the molded resin 11.

As it is illustrated in FIG. 28, when the light emitting component 40 is mounted on the molded package 2010, the solder is used in the form of solder paste. When the solder is molten by reflow, the light emitting component 40 on the molten solder is self-aligned due to the effect of a surface tension of the solder. The self-alignment of the light emitting component 40 in the length direction (i.e., the y direction) is controlled by the first cutout 24 on the side of the first edge portion 23 and the second edge portion 25. Conceptually, the light emitting component 40 is self-aligned such that a center line between the first side 401 and the second side 402 of the light emitting component 40 matches a center line between the first cutout 24 of the first edge portion 23 and the second edge portion 25 in order to make a surface of the molten solder to a minimum size.

More specifically, in the present invention, the length 40L of the light emitting component 40 (which is equal to the length 40L of the mounting area 2060) is a value equal to or more than a distance 603L between the top portion 24t of the first cutout 24 and the second edge portion 25 and less than a distance 604L between the first edge portion 23 and the second edge portion 25. Therefore, the top portion 24t of the first cutout 24 becomes flush with the first side 401 of the light emitting component 40 or the top portion 24t is positioned underside of the light emitting component 40. Similarly, the second edge portion 25 becomes flush with the second side 402 of the light emitting component 40 or the second edge portion 25 is positioned on the underside of the light emitting component 40. As described above, the molten solder is deformed so as to be the surface thereof becomes the minimum. Therefore, the first side 401 of the light emitting component 40 is applied with a stress such that a distance between the first side 401 and the top portion 24t of the first cutout 24 becomes shorter and the second side 402 of the light emitting component 40 is applied with a stress such that a distance between the second side 402 and the second edge portion 25 becomes shorter. As a result thereof, the light emitting component 40 is self-aligned at a position (i.e., the mounting area 60) where the stress that the two sides 401 and 402 are suffered from the molten solder is balanced (see, FIG. 28).

The self-alignment effect can be produced not only with the light emitting component 40 including the submount but also with the light emitting component 40 including only the light emitting element.

According to the above described reasons, the length 60L of the mounting area 2060 is set to a value equal to or more than a distance 603L between the first cutout 24 and the second edge portion 25 and less than a distance 604L between the first edge portion 23 and the second edge portion 25. Accordingly, a position of the light emitting component 40 in the length direction (i.e., the y direction) can be accurately self-aligned and mounted on the mounting position 2060.

The "distance 603L between the first cutout 24 and the second edge portion 25" indicates a distance from the top portion 24t of the first cutout 24 to the second edge portion 25.

The "distance 604L between the first edge portion 23 and the second edge portion 25" is a distance from the tip 13t of the projecting portion 13 (i.e., a portion of the first edge portion 23 closest to the second edge portion 25) to the second edge portion 25.

In the present embodiment, the projecting portion 13 projecting from the inner side surface 122 of the recess portion 12 of the molded resin 11 into the recess portion 12 is always required to be provided. The projecting portion 13 partially covers the first cutout 24 except for the top portion 24t of the first cutout 24 (see, FIG. 26). Since the periphery of the first cutout 24 is sealed from the inside of the recess portion 12 by the projecting portion 13, the sealing resin 52 can be effectively prevented from being leaked through the periphery of the first cutout 24. The top portion 24t of the first cutout 24 is not covered by the projecting portion 13, so that the self-alignment effect of the light emitting component 40 owing to the first cutout 24 will not be disturbed.

Provision of the projecting portion 13 can improve the strength of the inner side surface 122 (specifically, of a side of the first lead 2020) of the molded resin 11. The first lead 2020 is cut from the lead frame in a final step of the manufacturing process of the light emitting device 2050. At the time, the first lead 2020 flexes to apply a stress to the molded resin 11. The projecting portion 13 contributes to improvement of the strength of the molded resin 11, so that the molded resin 11 can bear the stress. As a result thereof, the detachment suppressing effect between the first lead and the molded resin and the breakage suppressing effect of the molded resin can be produced.

In the molded package 2010 of the present embodiment, since the second edge portion 25 of the first lead 2020 is not provided with the second cutout, the self-alignment effect of the light emitting component 40 owing to the second cutouts cannot be produced. On the other hand, in the first lead 2020 of the present embodiment, a length of the second edge portion 25 is shorter than a length of the second edge portion 25 on which the plurality of second cutouts 26 are formed (see, for example, FIG. 10). Therefore, a boundary surface between the second edge portion and the molded resin 11 decreases, so that a possible leakage of the sealing resin 52 to the rear surface 14 of the molded package 10 decreases than the case of the first embodiment.

In the molded package 2010 of the present embodiment, the light emitting component 40 can be self-aligned to be mounted owing to the first cutout 24 and the sealing resin 52 for sealing the light emitting component 40 can be prevented by the projecting portion 13 from being leaked to the rear surface of the molded package 2010.

Example 1

As Example of the present invention, prepared are two different light emitting devices such as sixteen light emitting devices 50 and sixteen comparative light emitting devices 500 in order to verify the self-alignment effect.

Figure 29:
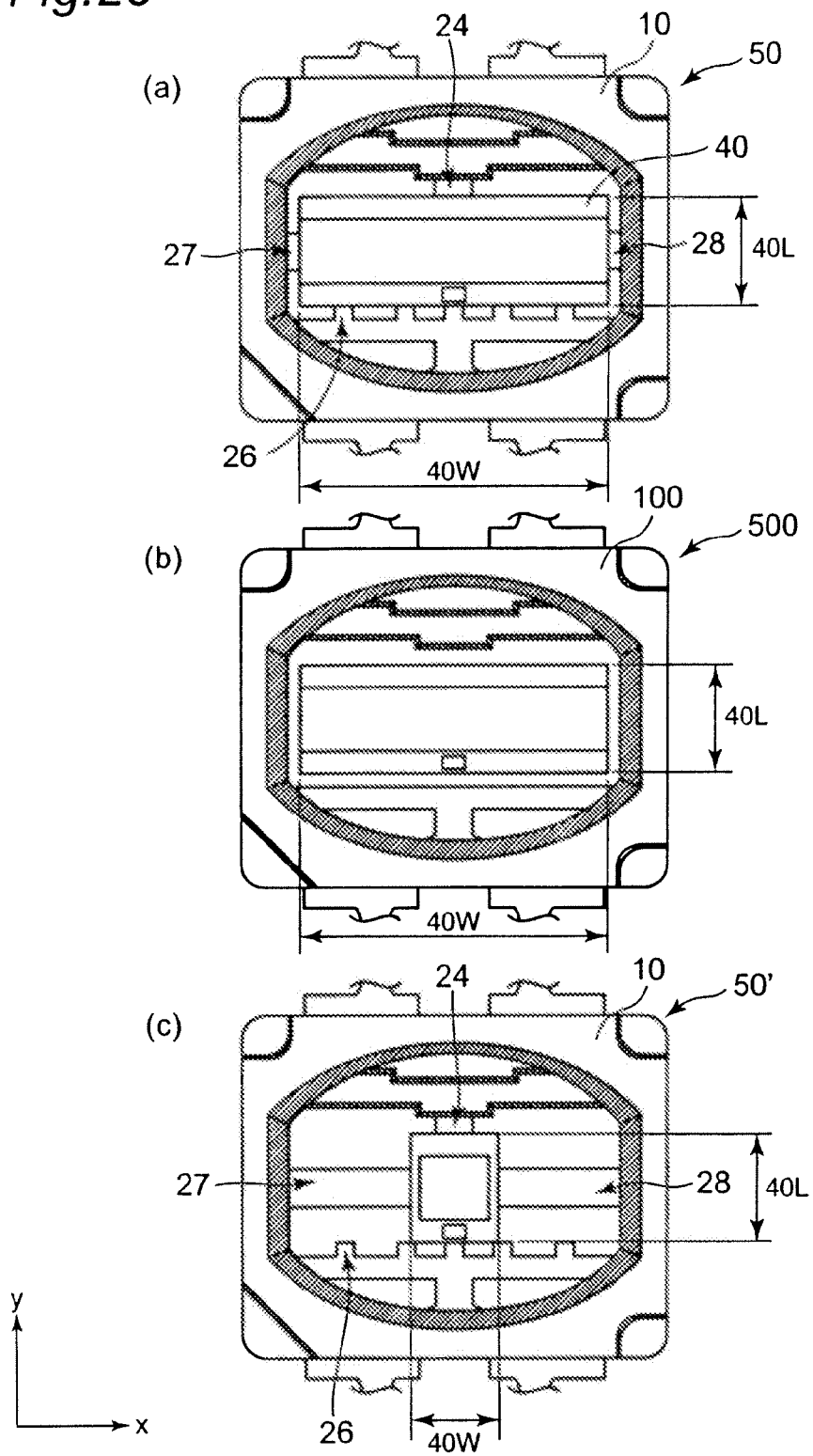
FIG. 29(a) is a first light emitting device according to the embodiment of the present invention.
FIG. 29(b) is a light emitting device according to a comparative example.
FIG. 29(c) is a second light emitting device according to the embodiment of the present invention.

FIG. 29(*a*) illustrates the light emitting device 50 according to Example of the present invention on which the light emitting component 40 including five light emitting elements 42 is mounted. The light emitting component 40 used here has the length 40L of 2.3 mm and the width 40W of 5.8 mm. The molded package 10 is formed with the first cutout 24, the plurality of second cutouts 26, the third cutout 27, and the fourth cutout 28. The mounting area 60 for the molded package 10 (FIG. 6) has the length 60L (a distance between the first cutout 24 and the plurality of second cutouts 26) of 2.3 mm and the width 60W (a distance between the third cutout 27 and the fourth cutout 28) of 5.8 mm.

FIG. 29(*b*) illustrates the comparative light emitting device 500 on which the light emitting component 40 including five light emitting elements 42 is mounted. The light emitting component 40 used here has the length 40L of 2.3 mm and the width 40W of 5.8 mm. The molded package 100 has a size and a shape almost identical to those of the light emitting device 50 illustrated in FIG. 29(*a*) except that the light emitting device 50 does not have either one of the first cutout 24, the second cutouts 26, the third cutout 27, or the fourth cutout 28.

FIG. 29(*c*) illustrates the light emitting device 50' according to Example of the present invention on which the light emitting component 40 including a singular light emitting element 42 is mounted. The light emitting component 40 to be used here has the length 40L of 2.3 mm and the width 40W of 1.2 mm. The molded package 10 is formed with the first cutout 24, the plurality of second cutouts 26, the third cutout 27, and the fourth cutout 28. The mounting area 60 for the molded package 10 (FIG. 6) has the length (the distance between the first cutout 24 and the second cutouts 26) 60L of 2.3 mm and the width (the distance between the third cutout 27 and the fourth cutout 28) 60W of 1.2 mm.

A verification test of the self-alignment is performed as follows.

(1) applying AuSn paste on the first lead 20;
(2) mounting the light emitting component 40 on the AuSn paste;
(3) measuring a shifting amount of the light emitting component 40 with respect to the mounting area 60 (before the reflow);
(4) executing the reflow;
(5) measuring a shifting amount of the light emitting component 40 with respect to the mounting area 60 (after the reflow); and
(6) plotting the shifting amount (in the x direction and y direction) of the light emitting component 40 before and after the reflow into a graph.

FIGS. 30(*a*) to 30(*c*) illustrate the plotted graph, respectively.

As seen in a result of a case of the light emitting device 50 of FIG. 29(*a*) as Example of the present invention (FIG. 30(*a*)), the shifting amount becomes smaller after the reflow (symbol ●) than before the reflow (symbol Δ) in both of the x direction and the y direction. On the other hand, as seen in a result of a case of the comparative light emitting device 500 of FIG. 29(*b*) (FIG. 30(*b*)), the shifting amount becomes larger after the reflow (symbol ●) than before the reflow (symbol Δ) in both of the x direction and the y direction. On the basis of the above results, the self-alignment effect of the light emitting component 40 with the first to the fourth cutouts 24, 26, 27, and 28 formed on the first lead 20 of the molded package 10 was confirmed in the light emitting device 50 of the embodiment shown in FIG. 29(*a*).

As seen from a result of a case of the light emitting device 50' of FIG. 29(*c*) (FIG. 30(*c*)), similar to the result of the case of FIG. 30(*a*), the shifting amount becomes smaller after the reflow (symbol ●) than before the reflow (symbol Δ) in both of the x direction and the y direction. In view of the above, it is found that the self-alignment effect of the light emitting component 40 having the first to the fourth cutouts 24, 26, 27, and 28 is still effective even with a different width 40W (i.e., a size in the x direction) of the light emitting component 40.

In the light emitting device 50 shown in FIG. 29(*a*) and the light emitting device 50' shown in FIG. 29(*c*) according to the embodiments of the present invention, the shifting amount after the reflow is a value equal to or less than 0.03 mm (i.e., a value equal to or less than 30 μm) in both of the x direction and the y direction. Consequently, it is found that very accurate mounting of the light emitting component 40 can be achieved by the self-alignment.

What is claimed is:

1. A molded package comprising:
   a molded resin having a recess portion for accommodating a light emitting component; and
   a first lead and a second lead which are spaced from each other at a bottom surface of the recess portion of the molded resin and exposed from the bottom surface of the recess portion,
   wherein an exposed surface of the first lead has a first edge portion and a second edge portion which are opposed to each other such that a mounting area for the light emitting component is located therebetween in a first direction, the first edge portion having one first cutout and the second edge portion having a plurality of second cutouts, and
   wherein the mounting area for the light emitting component has a size in the first direction equal to or more than a distance between the first cutout and the second cutouts and less than a distance between the first edge portion and the second edge portion.

2. The molded package according to claim 1, wherein the second edge portion of the exposed surface of the first lead is opposed to the second lead.

3. The molded package according to claim 1,
   wherein the exposed surface of the first lead has a third edge portion and a fourth edge portion which are opposed to each other such that the mounting area for the light emitting component is located between the third edge portion and the fourth edge portion in a second direction perpendicular to the first direction, the third edge portion having a third cutout and the fourth edge portion having a fourth cutout, and
   wherein the mounting area for the light emitting component has a size in the second direction equal to or more than a distance between the third cutout and the fourth cutout and less than a distance between the third edge portion and the fourth edge portion.

4. A molded package comprising:
   a molded resin having a recess portion for accommodating a light emitting component; and
   a first lead and a second lead which are spaced from each other at a bottom surface of the recess portion of the molded resin and exposed from the bottom surface of the recess portion, wherein an exposed surface of the first lead that is exposed within the recess portion has a first cutout and a plurality of second cutouts which are opposed to each other in a first direction, and having a third cutout and a fourth cutout which are opposed to each other in a second direction perpendicular to the first direction, wherein the plurality of second cutouts is disposed between the first cutout and the second lead in the first direction, wherein the exposed surface of the first lead has a first edge portion and a second edge portion which are opposed to each other such that a mounting area for the light emitting component is located therebetween in the first direction, the first edge portion having the first cutout, the second edge portion having the plurality of second cutouts, the mounting area for the light emitting component having a size in the first direction equal to or more than a distance between the first cutout and the second cutouts and less than a distance between the first edge portion and the second edge portion, wherein the exposed surface of the first lead has a third edge portion and a fourth edge portion which are opposed to each other such that the mounting area for the light emitting component is located therebetween in the second direction, the third edge portion having the third cutout and the fourth edge portion having the fourth cutout, the mounting area for the light emitting component having a size in the second direction equal to or more than a distance between the third cutout and the fourth cutout and less than a distance between the third edge portion and the fourth edge portion, and wherein the second edge portion of the exposed surface of the first lead is opposed to the second lead.

5. The molded package according to claim 1, wherein two of the plurality of second cutouts are positioned on corners of the mounting area for the light emitting component.

6. The molded package according to claim 1, wherein the second cutouts are not exposed from a rear surface of the molded package.

7. The molded package according to claim 1, wherein the first lead is exposed from a rear surface of the molded package and the second cutouts are positioned on a side of the second lead relative to an exposed rear surface of the first lead.

8. The molded package according to claim 1, wherein an inner side surface of the recess portion of the molded resin is in contact with the first edge portion, the recess portion of the molded resin having a projecting portion projecting from the inner side surface of the recess portion, the first cutout being partially covered by the projecting portion except for a top portion of the first cutout.

9. The molded package according to claim 8, wherein the top portion has a step on a side of a rear surface of the molded package.

10. The molded package according to claim 1, wherein the first cutout has a width in a range from 0.2 mm to 1.2 mm.

11. The molded package according to claim 1, wherein the first cutout has a width narrower than a width of the mounting area for the light emitting component.

12. The molded package according to claim 1, wherein each of the second cutouts has a width in a range from 0.2 mm to 0.9 mm.

13. A light emitting device comprising:
a molded package according to claim 1;
a light emitting component mounted on the mounting area and electrically connected with an exposed surface of the second lead; and
a sealing resin for sealing the recess portion of the molded resin of the molded package accommodating the light emitting component.

14. A light emitting device comprising:
a molded package according to claim 4;
a light emitting component mounted on the mounting area and electrically connected with an exposed surface of the second lead; and
a sealing resin for sealing the recess portion of the molded resin of the molded package accommodating the light emitting component.

15. A method for manufacturing a light emitting device according to claim 13, comprising:
preparing a molded package according to claim 1;
mounting a light emitting component on the exposed surface of the first lead via solder paste, the solder paste being located on at least a part of the bottom surface of the recess portion of the molded resin of the molded package, the part of the bottom surface consisting of the exposed surface of the first lead, a surface area of the molded resin filling the first cutout formed on the first edge portion of the first lead, and another surface area of the molded resin filling the plurality of the second cutouts formed on the second edge portion of the first lead;
melting the solder paste and solidifying a molten solder;
electrically connecting the light emitting component with an exposed surface of the second lead; and
sealing the recess portion of the molded resin accommodating the light emitting component with a sealing resin.

16. A method for manufacturing a light emitting device according to claim 14, comprising:
preparing a molded package according to claim 4;
mounting a light emitting component on the exposed surface of the first lead via solder paste, the solder paste being located on at least a part of the bottom surface of the recess portion of the molded resin of the molded package, the part of the bottom surface consisting of the exposed surface of the first lead, a surface area of the molded resin filling the first cutout formed on the first edge portion of the first lead, and another surface area of the molded resin filling the plurality of the second cutouts formed on the second edge portion of the first lead;
melting the solder paste and solidifying a molten solder;
electrically connecting the light emitting component with an exposed surface of the second lead; and
sealing the recess portion of the molded resin accommodating the light emitting component with a sealing resin.

* * * * *